United States Patent
Huang et al.

(10) Patent No.: US 8,842,027 B2
(45) Date of Patent: Sep. 23, 2014

(54) ANALOG TO DIGITAL CONVERTER AND METHOD FOR EVALUATING CAPACITOR WEIGHTING OF DIGITAL-TO-ANALOG CONVERTER THEREOF

(71) Applicant: Industrial Technology Research Institute, Hsinchu (TW)

(72) Inventors: Xuan-Lun Huang, Changhua County (TW); Hao-Jen Lin, Taichung (TW); Jiun-Lang Huang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/845,121

(22) Filed: Mar. 18, 2013

(65) Prior Publication Data

US 2014/0184432 A1 Jul. 3, 2014

(30) Foreign Application Priority Data

Dec. 28, 2012 (TW) .............................. 101151074 A

(51) Int. Cl.
*H03M 1/10* (2006.01)
(52) U.S. Cl.
CPC .................................. *H03M 1/1009* (2013.01)
USPC ........................................... 341/120; 341/144
(58) Field of Classification Search
CPC ........ H03M 1/66; H03M 1/1009; H03M 1/10
USPC .......................................... 341/144, 120, 121
See application file for complete search history.

(56) References Cited

U.S. PATENT DOCUMENTS

| | | | |
|---|---|---|---|
| 4,399,426 A * | 8/1983 | Tan | 341/120 |
| 5,579,005 A | 11/1996 | Moroni | |
| 6,882,298 B2 | 4/2005 | Leung et al. | |
| 7,126,510 B2 * | 10/2006 | Alon et al. | 341/120 |
| 7,312,734 B2 * | 12/2007 | McNeill et al. | 341/120 |
| 7,408,490 B2 | 8/2008 | Melanson et al. | |
| 7,605,741 B2 | 10/2009 | Hurrell | |
| 7,609,184 B2 * | 10/2009 | Kuramochi et al. | 341/118 |
| 7,786,908 B2 | 8/2010 | Yoshinaga | |
| 7,944,379 B2 | 5/2011 | Ohnhaeuser et al. | |
| 7,986,253 B2 | 7/2011 | Cho et al. | |
| 8,164,504 B2 | 4/2012 | Cho et al. | |
| 8,416,107 B1 * | 4/2013 | Wan et al. | 341/120 |
| 2012/0001781 A1 | 1/2012 | Scanlan | |
| 2012/0081243 A1 | 4/2012 | Kim et al. | |

OTHER PUBLICATIONS

Liu et al., "A 12b 22.5/45MS/s 3.0mW 0.059mm2 CMOS SAR ADC Achieving Over 90dB SFDR", 2010 IEEE International Solid-State Circuits Conference, Feb. 2010, p. 380-p. 381.

(Continued)

*Primary Examiner* — Brian Young
(74) *Attorney, Agent, or Firm* — Jianq Chyun IP Office

(57) ABSTRACT

A method for evaluating capacitor weighting of an analog-to-digital (ADC) is provided. An equivalent weighting value of each composed capacitor in each sub-capacitor-array may be obtained by adding the switch device to the ADC which enables each sub-capacitor-array in a digital-to-analog (DAC) to be measured by each other. The ADC can calculate and then obtain a correct digital output by using the calibrated equivalent weighting and successive approximation result of each input signal.

22 Claims, 7 Drawing Sheets

(56) References Cited

OTHER PUBLICATIONS

Cho et al., "A 9-bit 80 MS/s Successive Approximation Register Analog-to-Digital Converter With a Capacitor Reduction Technique", IEEE Transactions on Circuits and Systems—II: Express Briefs, Jul. 2010, vol. 57, p. 502-p. 506.

Wong et al., "Parasitic Calibration by Two-Step Ratio Approaching Techinque for Split Capacitor Array SAR ADCs", 2009 International SoC Design Conference (ISOCC), Nov. 2009, p. 333-p. 336.

Liu et al., "A 600MS/s 30mW 0.13µm CMOS ADC Array Achieving Over 60dB SFDR with Adaptive Digital Equalization", 2009 IEEE International Solid-State Circuits Conference, Feb. 2009,p. 82-p. 83,83a.

Giannini et al., "An 820 µW 9b 40MS/s Noise-Tolerant Dynamic-SAR ADC in 90nm Digital CMOS", 2008 IEEE International Solid-State Circuits Conference, Feb. 2008, p. 238-p. 610.

Huang et al., "Testing and Calibration of SAR ADCs by MCT-Based Bit Weight Extraction", 2012 IEEE 18th International Mixed-Signal, Sensors, and Systems Test Workshop, May 2012, p. 1-p. 4.

\* cited by examiner

ANALOG TO DIGITAL CONVERTER AND METHOD FOR EVALUATING CAPACITOR WEIGHTING OF DIGITAL-TO-ANALOG CONVERTER THEREOF

CROSS-REFERENCE TO RELATED APPLICATION

This application claims the priority benefit of Taiwan application serial no. 101151074, filed on Dec. 28, 2012. The entirety of the above-mentioned patent application is hereby incorporated by reference herein and made a part of this specification.

TECHNICAL FIELD

The disclosure relates to a split capacitor array analog-to-digital converter (SCA ADC) and a method of evaluating capacitor weighting of a digital-to-analog converter thereof.

BACKGROUND

In recent years, integrated circuit design has been trending towards increasingly difficult demands on lowering power consumption and cost along with enhancing performance. In the design of front-end analog circuits, an efficient analog-to-digital converter (ADC) can drastically enhance the overall system performance. The ADC is responsible for converting the received analog signals into digital signals, and providing the digital signals for the operation of the back-end digital signal processing unit. Therefore, characteristics of the ADC such as its dynamic range, resolution, accuracy, linearity, sampling speed, power consumption, and its input stage are crucial factors which influence the overall system performance, and these characteristics serve as several parameters for evaluating the performance of the ADC.

For two categories in resolution and sampling speed, the application range of an ADC with 8-14 bits and one to several hundred mega samples per second (MSPS) is quite broad. Applications such as in the front-end of the base frequency or the intermediate frequency of a communication system, a biomedical imaging process such as the front-end of a ultrasonic imaging system, and the front-end of a laser array system are all within the range of applications. The ADC has many types of configurations, and when manufacturing an ADC matching the aforementioned specifications, a diverse array of configurations can be chosen. The mainstream ADC applied commercially is the pipeline analog-to-digital converter, or the pipeline ADC. However, in recent years, articles in prominent international journals have gravitated towards the successive approximation register analog-to-digital converter (SAR ADC) as a popular research direction, because the SAR ADC configuration almost does not require a direct current bias voltage. Since the SAR ADC requires a good amount of digital circuits for control and signal processing, when the manufacturing process enters the deep sub-micron, the chip area and the power consumption needed for a portion of the digital circuits can be effectively reduced. Accordingly, the SAR ADC is suitable for developing the intellectual property from a large scale system-on-chip (SoC). In many disclosures, the SAR ADC has lower consumption and smaller chip area when compared to the pipeline ADC with the same specification requirements. Therefore, the technical development of the SAR ADC framework has become an active field of research.

In the SCA SAR ADC, a key of linearity lies in matching of the composed capacitors in the DAC. Due to an influence of process variation, a designer generally uses a larger unit capacitance to satisfy the demand of matching, such that the DAC is accounted for a large proportion in chip area and power consumption in the whole SAR ADC, and the larger area of the DAC represents that a driving circuit of the DAC is required to have a greater driving force, which further increase the area and the power consumption. Since the cost of the digital circuit is quite low, if the processing technique of the digital circuit can be used to decrease or even eliminate the demand of the DAC on matching of the composed elements therein, the whole chip area and power consumption of the SCA SAR ADC can be effectively decreased.

SUMMARY

An exemplary embodiment of the disclosure provides a method for evaluating capacitor weighting of a digital-to-analog converter (DAC). The method for evaluating capacitor weighting includes following steps. At least one of capacitor groups are selected as a target group, and at least one of the capacitor groups other than the target group are selected as a reference group. The reference group is used to measure a weighting code of each of the composed capacitors in the target group, and a group weighting value of each of the composed capacitors in the target group is calculated according to the weighting code. At least one of the capacitor groups not serving as the target group are selected as a new target group, and at least one of the capacitor groups other than the new target group are selected as a new reference group. The new reference group is used to measure the weighting code of each of the composed capacitors in the new target group, and the group weighting value of each of the composed capacitors in the new target group is calculated according to the weighting code. The aforementioned two steps are repeated until the group weighting values of all the composed capacitors in the DAC are obtained. An equivalent weighting value of each of the composed capacitors is obtained according to the weighting code and the group weighting value of each of the composed capacitors in each of the capacitor groups.

An exemplary embodiment of the disclosure provides an analog-to-digital converter (ADC) including a digital-to-analog converter (DAC), a comparator, a switch device and a calibration logic circuit. The DAC includes a reference capacitor, N composed capacitors and M−1 bridge capacitors. The composed capacitors are grouped into M capacitor groups, and the bridge capacitors are used to connect each of the capacitor groups. The comparator has a first input terminal, a second input terminal and an output terminal, and is used to compare inputs of the first input terminal and the second input terminal, and output a comparison result through the output terminal. The switch device is coupled to the reference capacitor, at least one of the capacitor groups, at least one of the bridge capacitors and the comparator. The calibration logic circuit is coupled to the DAC, the comparator and the switch device. The calibration logic circuit controls the switch device to select at least one of the capacitor groups as a target group, and select at least one of the capacitor groups other than the target group as a reference group, and uses the reference group to measure a weighting code of each of the composed capacitors in the target group, and calculates a group weighting value of each of the composed capacitors in the target group according to the weighting code, and obtains an equivalent weighting value of each of the composed capacitors according to the group weighting value of each of the composed capacitors.

An exemplary embodiment of the disclosure provides a method for evaluating capacitor weighting of a digital-toanalog converter (DAC). The method for evaluating capacitor weighting includes following steps. A first capacitor group is used to measure a weighting code of each of the composed capacitors in a second capacitor group, and a group weighting value of each of the composed capacitors in the second capacitor group is calculated according to the weighting code. The second capacitor group is used to measure the weighting code of each of the composed capacitors in the first capacitor group, and the group weighting value of each of the composed capacitors in the first capacitor group is calculated according to the weighting code. An equivalent weighting value of each of the composed capacitors is obtained according to the weighting code and the group weighting value of each of the composed capacitors in the first capacitor group and the second capacitor group.

Another exemplary embodiment of the disclosure provides an analog-to-digital converter (ADC) including a digital-to-analog converter (DAC), a comparator, a switch device and a calibration logic circuit. The DAC includes a reference capacitor, N composed capacitors and a bridge capacitor. The composed capacitors are grouped into a first capacitor group and a second capacitor group, and the bridge capacitor is used to connect the first capacitor group and the second capacitor group. The comparator has a first input terminal, a second input terminal and an output terminal, and is used to compare inputs of the first input terminal and the second input terminal, and output a comparison result through the output terminal. The switch device is coupled to the reference capacitor, the first capacitor group, the second capacitor group and the comparator. The calibration logic circuit is coupled to the DAC, the comparator and the switch device. The calibration logic circuit controls the switch device to use the first capacitor group to measure a weighting code of each of the composed capacitors in the second capacitor group, and calculates a group weighting value of each of the composed capacitors in the second capacitor group according to the weighting code, and uses the second capacitor group to measure a weighting code of each of the composed capacitors in the first capacitor group, and calculates a group weighting value of each of the composed capacitors in the first capacitor group according to the weighting code, and obtains an equivalent weighting value of each of the composed capacitors according to the weighting code and the group weighting value of each of the composed capacitors.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
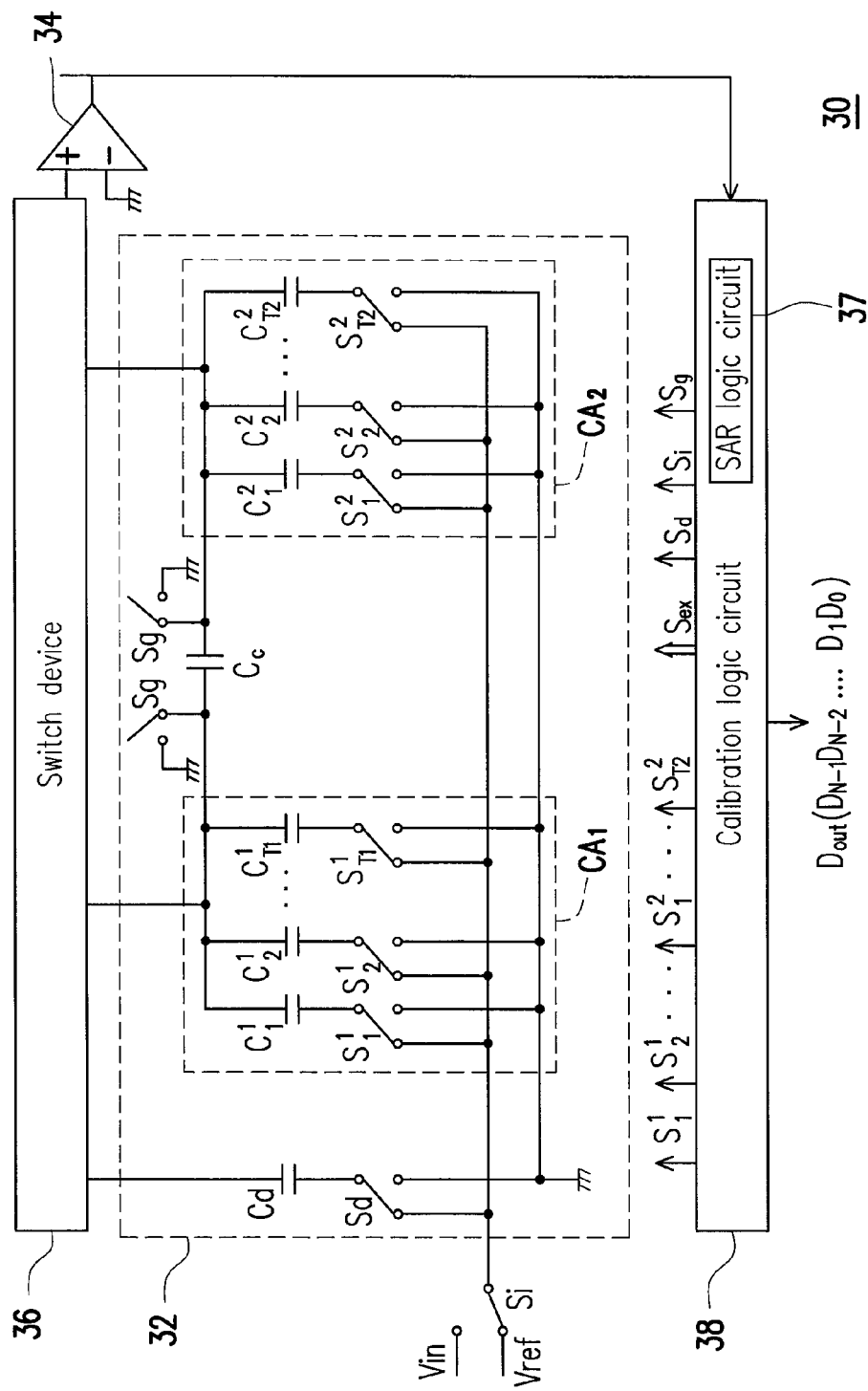
FIG. 1 is a simplified circuit diagram of an ADC according to an embodiment of the disclosure.

The disclosure discloses an analog-to-digital converter (ADC), FIG. 1 is a simplified circuit diagram of an ADC according to an embodiment of the disclosure. Referring to FIG. 1, the ADC 30 includes a digital-to-analog converter 32, a comparator 34, a switch device 36 and a calibration logic circuit 38. The DAC 32 includes a reference capacitor $C_d$, a bridge capacitor $C_c$ and N composed capacitors grouped into two capacitor groups $CA_1$ and $CA_2$, where the first capacitor group $CA_1$ includes T1 composed capacitors $C_1^1, C_2^1, \ldots, C_{T1}^1$, and the second capacitor group $CA_2$ includes T2 composed capacitors $C_1^2, C_2^2, \ldots, C_{T2}^2$. The bridge capacitor Cc is used to connect the first capacitor group $CA_1$ and the second capacitor group $CA_2$, where N is an integer greater than 1, and T1 and T2 are integers greater than 1, and a sum of T1 and T2 is equal to N.

For example, in a 12-bit ADC of N=12, the DAC thereof includes the reference capacitor $C_d$ and 12 composed capacitors grouped into the first capacitor group $CA_1$ and the second capacitor group $CA_2$, where the first capacitor group $CA_1$ may include 6 composed capacitors $C_1^1, C_2^1, \ldots, C_6^1$, and the second capacitor group $CA_2$ correspondingly includes 6 composed capacitors $C_1^2, C_2^2, \ldots, C_6^2$. If the first capacitor group $CA_1$ includes 4 composed capacitors $C_1^1, C_2^1, \ldots, C_4^1$, the second capacitor group $CA_2$ correspondingly includes 8 composed capacitors $C_1^2, C_2^2, \ldots, C_8^2$ to make up the total 12 composed capacitors, which is not limited by the disclosure. Moreover, each of the aforementioned composed capacitors has a corresponding weighting value, and in the present embodiment, the weighting value of the capacitor can be interpreted as a capacitance value.

Referring to FIG. 1, the comparator 34 has a first input terminal, a second input terminal and an output terminal. The comparator 34 compares inputs of the first input terminal and the second input terminal, and outputs a comparison result through the output terminal. The switch device 36 is coupled to the reference capacitor $C_d$, the first capacitor group $CA_1$, the second capacitor group $CA_2$ and the comparator 34. Each of the aforementioned composed capacitors has a first end and a second end, and the first ends of all the composed capacitors are coupled to the switch device 36, and a first end of the reference capacitor $C_d$ is also coupled to the switch device 36.

The switch device 36 selects to connect the first capacitor group $CA_1$ or the second capacitor group $CA_2$ to the comparator 34, i.e. to switch a connection relationship of the two capacitor groups in the DAC. In detail, the switching device 36 can couple the first capacitor group $CA_1$ to the comparator 34 and one end of the bridge capacitor $C_c$, and couple the other end of the bridge capacitor $C_c$ to the second capacitor group $CA_2$ and the reference capacitor $C_d$. The switching device 36 can also couple the second capacitor group $CA_2$ to the comparator 34 and one end of the bridge capacitor $C_c$, and couple the other end of the bridge capacitor $C_c$ to the first capacitor group $CA_1$ and the reference capacitor $C_d$. The switch device 36 can be a switch, a multiplexer, a logic circuit or a combination thereof, which is not limited by the disclosure.

Referring to FIG. 1, the calibration logic circuit 38 is coupled to the DAC 32, the comparator 34 and the switch device 36. The calibration logic circuit 38 controls the switch device 36 to use the first capacitor group $CA_1$ to measure weighting codes $K_1^2, K_2^2, \ldots, K_{T2}^2$ of each of the composed capacitors $C_1^2, C_2^2, \ldots, C_{T2}^2$ in the second capacitor group $CA_2$, and calculates group weighting values $W_1^2$-$W_{T2}^2$ of each of the composed capacitors $C_1^2$-$C_{T2}^2$ in the second capacitor group $CA_2$ according to the weighting codes $K_1^2$-$K_{T2}^2$. The calibration logic circuit 38 controls the switch device 36 to use the second capacitor group $CA_2$ to measure weighting codes $K_1^1, K_2^1, \ldots, K_{T1}^1$ of each of the composed capacitors $C_1^1, C_2^1, \ldots, C_{T1}^1$ in the first capacitor group $CA_1$, and calculates group weighting values $W_1^1, W_2^1, \ldots, W_{T1}^1$ of each of the composed capacitors $C_1^1$-$C_{T1}^1$ in the first capacitor group $CA_1$ according to the weighting codes $K_1^1$-$K_{T1}^1$. The calibration logic circuit 38 obtains equivalent weighting values $W'^1_1$-$W'^1_{T1}$ and $W_1^2$-$W_{T2}^2$ of each of the composed capacitors $C_1^1$-$C_{T1}^1$ and $C_1^2$-$C_{T2}^2$ according to the weighting codes $K_1^1$-$K_{T1}^1$ and $K_1^2$-$K_{T2}^2$ and the group weighting values $W_1^1$-$W_{T1}^1$ and $W_1^2$-$W_{T2}^2$ of each of the composed capacitors $C_1^1$-$C_{T1}^1$ and $C_1^2$-$C_{T2}^2$, and detailed steps of estimating the group weighting values and the equivalent weighting values are described later.

The calibration logic circuit 38 includes a successive approximation register (SAR) logic circuit 37. The SAR logic circuit 37 is coupled to the comparator 34 and the DAC 32, and the SAR logic circuit 37 selects an input value of all the composed capacitors $C_1^1$-$C_{T1}^1$ and $C_1^2$-$C_{T2}^2$ to be one of a first value $V_1$ and a second value $V_0$ according to the output of the comparator 34, so as to obtain the weighting codes $W_1^1$-$W_{T1}^1$ and $W_1^2$-$W_{T2}^2$ of the composed capacitors $C_1^1$-$C_{T1}^1$ and $C_1^2$-$C_{T2}^2$. In the present embodiment, the first value $V_1$ and the second value $V_0$ can be respectively voltage values VRT and VRB or voltage values $V_{ref}$ and 0, though the disclosure is not limited thereto.

Figure 2:
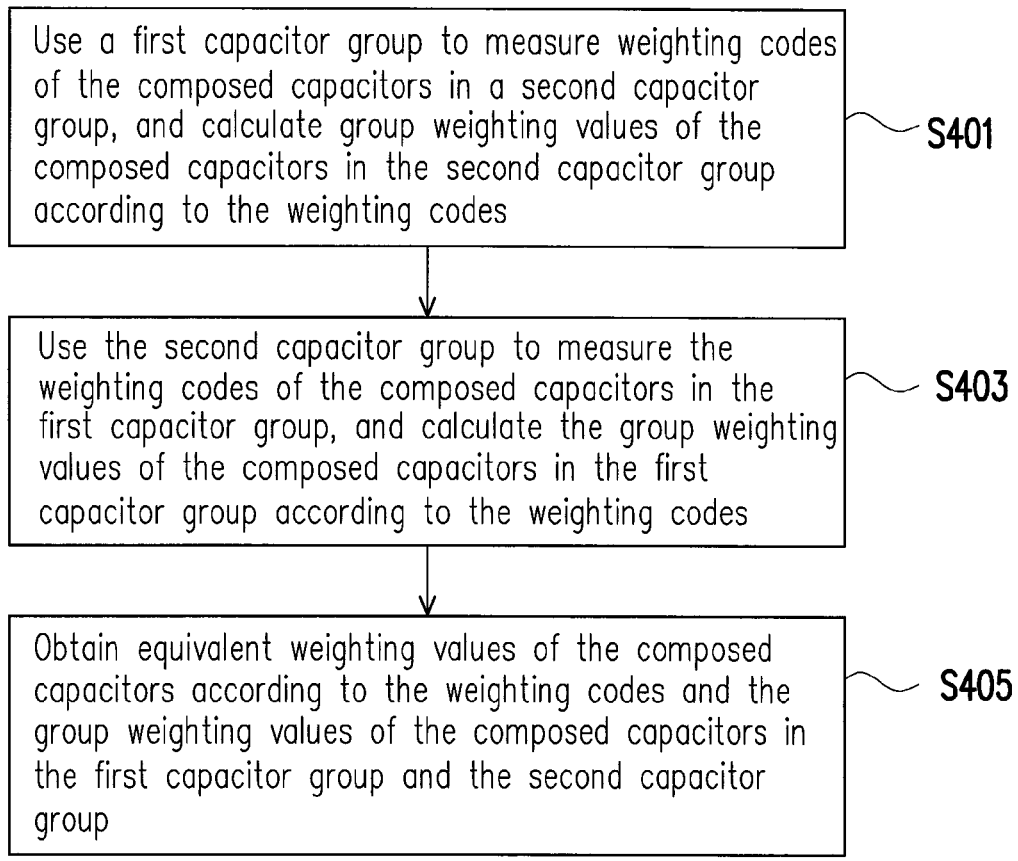
FIG. 2 is a flowchart illustrating a method for evaluating capacitor weighting according to an embodiment of the disclosure.

FIG. 2 is a flowchart illustrating a method for evaluating capacitor weighting according to an embodiment of the disclosure. Referring to FIG. 1 and FIG. 2, the method for evaluating capacitor weighting can be applied to the ADC 30 of FIG. 1. In step S401, the first capacitor group $CA_1$ is used to measure the weighting codes $K_1^2, K_2^2, \ldots, K_{T2}^2$ of the composed capacitors $C_1^2, C_2^2, \ldots, C_{T2}^2$ in the second capacitor group $CA_2$, and the group weighting values $W_1^2$-$W_{r2}^2$ of the composed capacitors $C_1^2$-$C_{T2}^2$ in the second capacitor group $CA_2$ are calculated according to the weighting codes $K_1^2$-$K_{T2}^2$. A method of using the first capacitor group $CA_1$ to measure the weighting codes $K_1^2$-$K_{T2}^2$ of the composed capacitors $C_1^2$-$C_{T2}^2$ in the second capacitor group $CA_2$ may include following steps. In a first mode, for example, a sampling mode, the first value $V_1$ is input to an $i^{th}$ composed capacitor $C_i^2$ of the second capacitor group $CA_2$, and the second value $V_0$ is input to the other composed capacitors, where i is a positive integer greater than or equal to 1 and is smaller than or equal to T2.

In a second mode, for example, a charge redistribution mode, the second value $V_0$ is input to the $i^{th}$ composed capacitor $C_i^2$ of the second capacitor group $CA_2$, and the first value $V_1$ is input to at least one of the composed capacitors $C_1^1$-$C_{T1}^1$ of the first capacitor group $CA_1$, and the first value $V_1$ is input to at least one of the composed capacitors of the second capacitor group $CA_2$ other than the $i^{th}$ composed capacitor $C_i^2$, such that an output of the DAC 32 in the first mode approaches to that of the DAC 32 in the second mode, a weighting code $K_i^2$ of the $i^{th}$ composed capacitor $C_i^2$ in the second capacitor group $CA_2$ relative to the first capacitor group $CA_1$ is obtained according to the input value of the composed capacitors $C_1^1$-$C_{T1}^1$ of the first capacitor group $CA_1$ and the input value of the composed capacitors of the second capacitor group $CA_2$ other than the $i^{th}$ composed capacitor $C_i^2$.

The step of calculating the group weighting values $W_1^2$-$W_{T2}^2$ of the composed capacitors $C_1^2$-$C_{T2}^2$ in the second capacitor group $CA_2$ according to the weighting codes $K_1^2$-$K_{T2}^2$ is described in detail below. A group weighting value $W_{i+1}^2$ of an $(i+1)^{th}$ composed capacitor $C_{i+1}^2$ of the second capacitor group $CA_2$ is calculated according to a weighting code $K_{i+1}^2$ of the $(i+1)^{th}$ composed capacitor $C_{i+1}^2$ of the second capacitor group $CA_2$ and the group weighting values $W_1^2$-$W_i^2$ of the first, the second, . . . , and the $i^{th}$ composed capacitors $C_1^2$-$C_i^2$ of the second capacitor group $CA_2$.

In step S403, the second capacitor group $CA_2$ is used to measure the weighting codes $K_1^1$-$K_{T1}^1$ of the composed capacitors $C_1^1$-$C_{T1}^1$ in the first capacitor group $CA_1$, and the group weighting values $W_1^1$-$W_{T1}^1$ of the composed capacitors $C_1^1$-$C_{T1}^1$ in the first capacitor group $CA_1$ are calculated according to the weighting codes $K_1^1$-$K_{T1}^1$, where the measuring method and steps thereof are similar to the aforementioned method and steps of using the first capacitor group $CA_1$ to measure the composed capacitors $C_1^2$-$C_{T1}^2$ of the second capacitor group $CA_2$, which are not repeated. Namely, the first capacitor group $CA_1$ and the second capacitor group $CA_2$ can be used to measure each other, so as to obtain the group weighting values of the composed capacitors in the capacitor group. The aforementioned measuring sequence is only an exemplary embodiment, for example, the second capacitor group can also be used to measure the first capacitor group first, and then the first capacitor group is used to measure the second capacitor group, which is not limited by the disclosure.

In step S405, the equivalent weighting values $W'^1_1$-$W'^1_{T1}$ and $W'^2_1$-$W'^2_{T2}$ of the composed capacitors $C_1^1$-$C_{T1}^1$ and $C_1^2$-$C_{T2}^2$ are obtained according to the weighting codes $K_1^1$-$K_{T1}^1$ and $K_1^2$-$K_{T2}^2$ and the group weighting values $W_1^1$-$W_{T1}^1$ and $W_1^2$-$W_{T2}^2$ of the composed capacitors $C_1^1$-$C_{T1}^1$ and $C_1^2$-$C_{T2}^2$ in the first capacitor group $CA_1$ and the second capacitor group $CA_2$. Details of the step S405 are as follows. An equivalent weighting value $W'^2_{i+1}$ of an $(i+1)^{th}$ composed capacitor $C_{i+1}^2$ of the second capacitor group $CA_2$ is calculated according to the weighting code $K_{i+1}^2$ of the $(i+1)^{th}$ composed capacitor $C_{i+1}^2$ of the second capacitor group $CA_2$, the group weighting values $W_1^2$-$W_i^2$ of the first to the $i^{th}$ composed capacitors $C_1^2$-$C_i^2$ of the second capacitor group $CA_2$ and the group weighting values $W_1^1$-$W_{T1}^1$ of the first to the $T1^{th}$ composed capacitors $C_1^1$-$C_{T1}^1$ of the first capacitor group $CA_1$, or an equivalent weighting value $W'^1_{j+1}$ of a $(j+1)^{th}$ composed capacitor $C_{j+1}^1$ of the first capacitor group $CA_1$ is calculated according to the weighting code $K_{j+1}^1$ of the $(j+1)^{th}$ composed capacitor $C_{j+1}^1$ of the first capacitor group $CA_1$, the group weighting values $W_1^1$-$W_j^1$ of the first to the $j^{th}$ composed capacitors $C_1^1$-$C_j^1$ of the first capacitor group $CA_1$ and the group weighting values $W_1^2$-$W_{T2}^2$ of the first to the $T2^{th}$ composed capacitors $C_1^2$-$C_{T2}^2$ of the second capacitor group $CA_2$, where i is an integer greater than or equal to 1 and is smaller than or equal to T2, and j is an integer greater than or equal to 1 and is smaller than or equal to T1. The step S405 is repeated by R times, where R is an integer greater than or equal to 1. In other words, after the group weighting values of each of the composed capacitors are obtained, the step S405 is repeated to obtain new equivalent weighting values through multiple iterative calculations.

It should be noticed that in the process of calculating the equivalent weighting values, the equivalent weighting value of each of the composed capacitors in each of the capacitor groups can be used to replace the old group weighting value, and the new group weight value and the weighting code of each of the composed capacitors are again used to obtain the new equivalent weighting value, and repeat calculations are performed to obtain the equivalent weighting value closer to an actual situation. In this way, the obtained equivalent weighting values can be used to ameliorate the problem of nonlinearity of the conversion curve of the ADC caused by capacitor mismatch. In brief, the equivalent weighting value of the composed capacitor representing a more significant bit (MSB) is large, and the equivalent weighting value of the composed capacitor representing a less significant bit (LSB) is small. The obtained equivalent weighting values of the composed capacitors can be used to ameliorate conversion linearity of the ADC.

Figure 3:
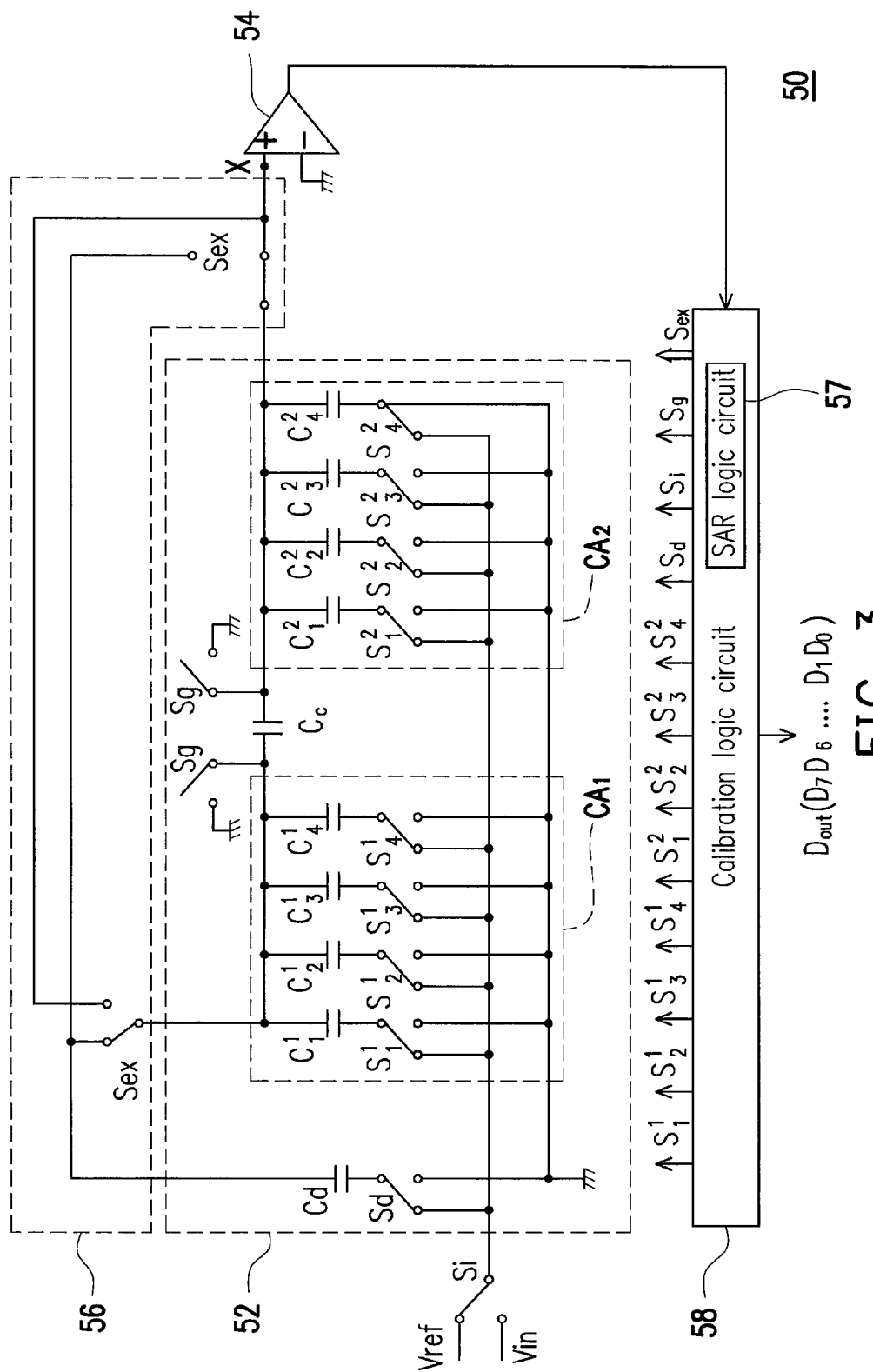
FIG. 3 is a simplified circuit diagram of an 8-bit ADC according to an embodiment of the disclosure.

To describe the disclosure in detail, an 8-bit SCA SAR ADC is taken as an example to describe how to evaluate the weighting value of the composed capacitor. FIG. 3 is a simplified circuit diagram of an 8-bit ADC 50 according to an embodiment of the disclosure. The ADC 50 includes a DAC 52, a comparator 54, a switch device 56 and a calibration logic circuit 58. The DAC 52 includes a reference capacitor $C_d$, a bridge capacitor $C_c$, and 8 composed capacitors grouped into two capacitor groups $CA_1$ and $CA_2$, where the capacitor group $CA_1$ includes four composed capacitors $C_1^1, C_2^1, \ldots, C_4^1$, and the capacitor group $CA_2$ includes four composed capacitors $C_1^2, C_2^2, C_4^2$. The bridge capacitor $C_c$ is used to connect the capacitor group $CA_1$ and the capacitor group $CA_2$. A coupling relation and functions of the components are the same or similar to that in the embodiment shown in FIG. 1, and details thereof are not repeated. It should be noticed that as shown in FIG. 3, the switch device 56 of the present embodiment is composed of two switches $S_{ex}$.

In the present embodiment, the switches $S_{ex}$ can be switched to implement using the capacitor group $CA_1$ to measure the capacitor group $CA_2$ or using the capacitor group $CA_2$ to measure the capacitor group $CA_1$. It is assumed that the capacitor group $CA_1$ is first used to measure the capacitor group $CA_2$. In the sampling mode, the switch $S_i$ is switched to connect the reference voltage $V_{ref}$, the switch $S_g$ is turned on, and the switch $S_1^2$ is switched to connect the reference voltage $V_{ref}$ such that the composed capacitor $C_1^2$ is charged to the reference voltage $V_{ref}$, and the other switches $S_d$, $S_2^2$-$S_4^2$ and $S_1^1$-$S_4^1$ are all switched to a ground voltage, and the corresponding reference capacitor $C_d$ and the composed capacitors $C_2^2$-$C_4^2$ and $C_1^1$-$C_4^1$ are all 0 voltage. The switch $S_g$ is turned off, and the switch $S_1^2$ is switched to connect the ground potential. In the charge redistribution mode, the switch $S_i$ is switched to connect the reference voltage $V_{ref}$, the switch $S_g$ is turned off, and the switches $S_2^2$-$S_4^2$ and $S_1^1$-$S_4^1$ are switched according to a 8-bit control signal, and after a successive approximation operation, the voltage generated by the DAC 52 due to charging of the composed capacitor $C_1^2$ approaches to 0, i.e. when the open circuit equivalent outputs of the two modes approach to be equal, the weighting code of the composed capacitor $C_1^2$ can be obtained according to conducting states of the switches $S_2^2$-$S_4^2$ and $S_1^1$-$S_4^1$. Deduced by analogy, the weighting values of all the composed capacitors $C_1^1$-$C_4^1$ in the capacitor group $CA_1$ can be obtained according to the above method, and details thereof are not repeated.

In an ideal situation, the composed capacitors $C_1^1$-$C_4^1$ and $C_2^2$-$C_4^2$ in the capacitor groups $CA_1$ and $CA_2$ can take radix-2 as capacitance values. However, due to the capacitor mismatch caused by process variation, the capacitance values of the composed capacitors $C_1^1$-$C_4^1$ and $C_2^2$-$C_4^2$ can be shifted. In order to clearly describe how to obtain the weighting values, in the present exemplary embodiment, it is assumed that the reference voltage $V_{ref}$ is equal to 1V, the capacitance value of the bridge capacitor $C_c$ is equal to 2C, the capacitance value of the reference capacitor $C_d$ is equal to 1C, and real capacitance values of the composed capacitors $C_1^1$-$C_4^1$ and $C_2^2$-$C_4^2$ and weighting ratios there between are shown in a following table 1:

TABLE 1

| Capacitance | Capacitance value | Real capacitor weighting ratio |
|---|---|---|
| $C_1^1$ | 1 C | 1 |
| $C_2^1$ | 1.9 C | 2 |
| $C_3^1$ | 3.3 C | 3.4 |
| $C_4^1$ | 5.8 C | 6 |
| $C_1^2$ | 1 C | 8.2 |
| $C_2^2$ | 1.8 C | 14.3 |
| $C_3^2$ | 3.5 C | 27.1 |
| $C_4^2$ | 6.8 C | 52.4 |

First, the composed capacitor $C_1^2$ is measured, in the sampling mode, the switch $S_i$ is switched to connect the reference voltage $V_{ref}$, the switch $S_g$ is turned on, and the switch $S_1^2$ is switched to connect the reference voltage $V_{ref}$ such that the composed capacitor $C_1^2$ is charged to the reference voltage $V_{ref}$ (i.e. a cross voltage of the composed capacitor $C_1^2$ is 1V). The other switches $S_d$, $S_2^2$-$S_4^2$ and $S_1^1$-$S_4^1$ are all switched to the ground voltage, and the corresponding reference capacitor $C_d$ and the composed capacitors $C_2^2$-$C_4^2$ and $C_1^1$-$C_4^1$ are all 0 voltage. Then, the switch $S_g$ is turned off, and the switch $S_1^2$ is switched to connect the ground potential. According to the above assumption, it is known that a total capacitance value of the capacitor group $CA_2$ is 6.8C+3.5C+1.8C+1C=13.1C, and a total capacitance value of the capacitor group $CA_1$ is 5.8C+3.3C+1.9C+1C+1C=13C. A voltage of the node X is:

$$V_x = -\frac{1}{13.1 + \frac{13*2}{13+2}} = -0.0674V$$

In the charge redistribution mode, the switch $S_i$ is still switched to connect the reference voltage $V_{ref}$, the switch $S_g$ is turned off, and the switches $S_2^2$-$S_4^2$ and $S_1^1$-$S_4^1$ are switched according to a 8-bit control signal, and after the successive approximation operation, the voltage generated by the DAC 32 due to charging of the composed capacitor $C_1^2$ approaches to 0, i.e. when the open circuit equivalent outputs of the two modes approach to be equal, the weighting code of the composed capacitor $C_1^2$ can be obtained according to conducting states of the switches $S_2^2$-$S_4^2$ and $S_1^1$-$S_4^1$. In the present exemplary embodiment, after the successive approximation operation, the obtained result indicates that the voltage $$\frac{7.7}{13 + \frac{13.1*2}{13.1+2}} * \frac{2}{2 + 13.1} = 0.0692V$$

generated by turning on the switch $S_4^1$ and the switch $S_2^1$ can make the voltage of the node X to approach to 0. Namely, the composed capacitor $C_1^2$ of the capacitor group $CA_2$ can be equivalent to the composed capacitors $C_4^1$ and $C_2^1$ of the capacitor group $CA_1$. The weighting code $K_1^2$ of the composed capacitor $C_1^2$ can be represented by [1010]. In other words, each bit of the weighting code $K_1^2$ also represents conducting states of the switches $S_1^1$-$S_4^1$. The same method is used to measure each of the composed capacitors in the capacitor group $CA_2$. It should be noticed that when the composed capacitors $C_2^2$-$C_4^2$ are measured, the composed capacitor with lower bit is also added to the successive approximation operation. For example, when the composed capacitor $C_2^2$ is measured, the composed capacitor $C_1^2$ is also added to the successive approximation operation. In this way, the weighting codes $K_1^2$-$K_4^2$ of the composed capacitors $C_1^2$-$C_4^2$ of the capacitor group $CA_2$ are shown in a following table 2, though the table 2 is not used to limit the disclosure.

TABLE 2

| Capacitor | Weighting code |
|---|---|
| $C_1^2$ | $K_1^2$ = [1010] |
| $C_2^2$ | $K_2^2$ = [1-1000] |
| $C_3^2$ | $K_3^2$ = [11-0101] |
| $C_4^2$ | $K_4^2$ = [111-0010] |

Then, the group weighting values $W_1^2$-$W_4^2$ of the composed capacitors $C_1^2$-$C_4^2$ of the capacitor group $CA_2$ can be calculated according to the weighting values $K_1^2$-$K_4^2$. In detail, regarding the composed capacitor $C_1^2$, the group weighting value $W_1^2$ thereof corresponds to the weighting code $K_1^2$ converted from a binary code into a decimal value. Regarding the composed capacitor $C_2^2$, the group weighting value $W_2^2$ thereof is equal to the group weighting value $W_1^2$ plus the 4-bit weighting code $K_1^2$ converted from the binary code into decimal value, i.e. 10 $(W_1^2)$+8(1000)=18$(W_2^2)$. Deduced by analogy, the group weighting values $W_1^2$-$W_4^2$ are as that shown in a following table 3:

TABLE 3

| Capacitor | Weighting code | Group weighting value |
|---|---|---|
| $C_1^2$ | $K_1^2$ = [1010] | $W_1^2$ = 10 |
| $C_2^2$ | $K_2^2$ = [1-1000] | $W_2^2$ = 18 |
| $C_3^2$ | $K_3^2$ = [11-0101] | $W_3^2$ = 33 |
| $C_4^2$ | $K_4^2$ = [111-0010] | $W_4^2$ = 63 |

When the weighting codes $K_1^2$-$K_4^2$ of the composed capacitors $C_1^2$-$C_4^2$ of the capacitor group $CA_2$ are obtained, the capacitor group $CA_1$ and the capacitor group $CA_2$ can be exchanged by switching the switch $S_{ex}$, so as to use the capacitor group $CA_2$ to measure the weighting codes $K_1^1$-$K_4^1$ of the composed capacitors $C_1^1$-$C_4^1$ in the capacitor group $CA_1$, and calculate the group weighting values $W_1^1$-$W_4^1$ of the composed capacitors $C_1^1$-$C_4^1$ in the capacitor group $CA_1$ according to the weighting codes $K_1^1$-$K_4^1$, where the measuring method and steps thereof are similar to the aforementioned method and steps of using the capacitor group $CA_2$ to measure the composed capacitors $C_1^1$-$C_4^1$ of the capacitor group $CA_1$, which are not repeated. It should be noticed that after obtaining the weighting codes $K_1^1$-$K_4^1$ of the composed capacitors $C_1^1$-$C_4^1$, during a process of converting the weighting codes $K_1^1$-$K_4^1$ into the group weighting values, the obtained composed capacitors $C_1^2$-$C_4^2$ and the group weighting values $W_1^2$-$W_4^2$ can be used for calculation, so as to obtain the group weighting values $W_1^1$-$W_4^1$ of the composed capacitors $C_1^1$-$C_4^1$. For example, if the weighting code $K_1^1$ of the composed capacitor $C_1^2$ is $K_1^1$=[1000], the group weighting value $W_1^1$=$W_4^2$=63. According to the above descriptions, the weighting codes $K_1^1$-$K_4^1$ and the group weighting values $W_1^1$-$W_4^1$ of the composed capacitors $C_1^1$-$C_4^1$ of the capacitor group $CA_1$ obtained according to the method of the disclosure are shown in a following table 4.

TABLE 4

| Capacitor | Weighting code | Group weighting value |
|---|---|---|
| $C_1^1$ | $K_1^1$ = [1000] | $W_1^1$ = 63 |
| $C_2^1$ | $K_2^1$ = [1-1000] | $W_2^1$ = 63 + 63 = 126 |
| $C_3^1$ | $K_3^1$ = [11-0100] | $W_3^1$ = 126 + 63 + 33 = 222 |
| $C_4^1$ | $K_4^1$ = [110-0101] | $W_4^1$ = 222 + 126 + 33 + 10 = 391 |

The equivalent weighting values $W'_1^1$-$W'_4^1$ and $w'_1^2$-$W'_4^2$ of the composed capacitors $C_1^1$-$C_4^1$ and $C_1^2$-$C_4^2$ are obtained according to the weighting codes $K_1^1$-$K_4^1$ and $K_1^2$-$K_4^2$ and the group weighting values $W_1^1$-$W_4^1$ and $W_1^2$-$W_4^2$ of the composed capacitors $C_1^1$-$C_4^1$ and $C_1^2$-$C_4^2$ in the capacitor group $CA_1$ and the capacitor group $CA_2$. For example, the group weighting values $W_1^1$-$W_4^1$ of the composed capacitors $C_1^1$-$C_4^1$ in the capacitor group $CA_1$ are taken as the equivalent weighting values $W'_1^1$-$W'_4^1$ of the composed capacitors $C_1^1$-$C_4^1$ in the capacitor group $CA_1$, and the equivalent weighting values $W'_1^2$-$W'_4^2$ of the composed capacitors $C_1^2$-$C_4^2$ in the capacitor group $CA_2$ can be calculated according to the group weighting values $W_1^1$-$W_4^1$ of the composed capacitors $C_1^1$-$C_4^1$ in the capacitor group $CA_1$ and the weighting codes $K_1^2$-$K_4^2$ of the composed capacitors $C_1^2$-$C_4^2$ in the capacitor group $CA_2$.

In brief, the weighting code $K_1^2$ of the composed capacitor $C_1^2$ is [1010], so that the equivalent weighting value $W'_1^2$ of the composed capacitor $C_1^2$ is equal to $W_4^1$ plus $W_2^1$. The weighting code $K_2^2$ of the composed capacitor $C_2^2$ is [1-0110], so that the equivalent weighting value $W'_2^2$ of the composed capacitor $C_2^2$ is equal to $W_3^1$ plus $W_2^1$ plus $W'_1^2$. Deduced by analogy, the equivalent weighting values $W'_1^2$-$W'_4^2$ of the composed capacitors $C_1^2$-$C_4^2$ in the capacitor group $CA_2$ can be obtained, as that shown in a following table 5. In this way, according to the method of the disclosure, the equivalent weighting values of the composed capacitors in the DAC 52 can be evaluated, and real weighting ratios of the composed capacitors in the DAC 52 are evaluated. Comparing the table 1 and the table 5, it is known that the evaluated capacitor weighting ratios are very close to the real weighting ratios, which represents that the real weighting ratios of the capacitors can be accurately evaluated according to the measuring method of the disclosure, so as to decrease the adverse effects caused by capacitor mismatch, and ameliorate conversion linearity of the ADC.

TABLE 5

| Capacitor | Weighting code | Equivalent weighting value | Evaluated capacitor weighting ratio |
|---|---|---|---|
| $C_1^1$ | $K_1^1$ = [1000] | $W'_1^1$ = $W_1^1$ = 63 | 1 |
| $C_2^1$ | $K_2^1$ = [1-1000] | $W'_2^1$ = $W_2^1$ = 126 | 2 |
| $C_3^1$ | $K_3^1$ = [11-0100] | $W'_3^1$ = $W_3^1$ = 222 | 3.5 |
| $C_4^1$ | $K_4^1$ = [110-0101] | $W'_4^1$ = $W_4^1$ = 391 | 6.2 |
| $C_1^2$ | $K_1^2$ = [1010] | $W'_1^2$ = $W_4^1$ + $W_2^1$ = 517 | 8.2 |
| $C_2^2$ | $K_2^2$ = [1-1000] | $W'_2^2$ = $W_1^2$ + $W_4^1$ = 908 | 14.4 |
| $C_3^2$ | $K_3^2$ = [11-0101] | $W'_3^2$ = $W'_1^2$ + $W'_2^2$ + $W_3^1$ + $W_1^1$ = 1710 | 27.1 |
| $C_4^2$ | $K_4^2$ = [111-0010] | $W'_4^2$ = $W'_1^2$ + $W'_2^2$ + $W'_3^2$ + $W_2^1$ = 3261 | 51.8 |

Figure 4:
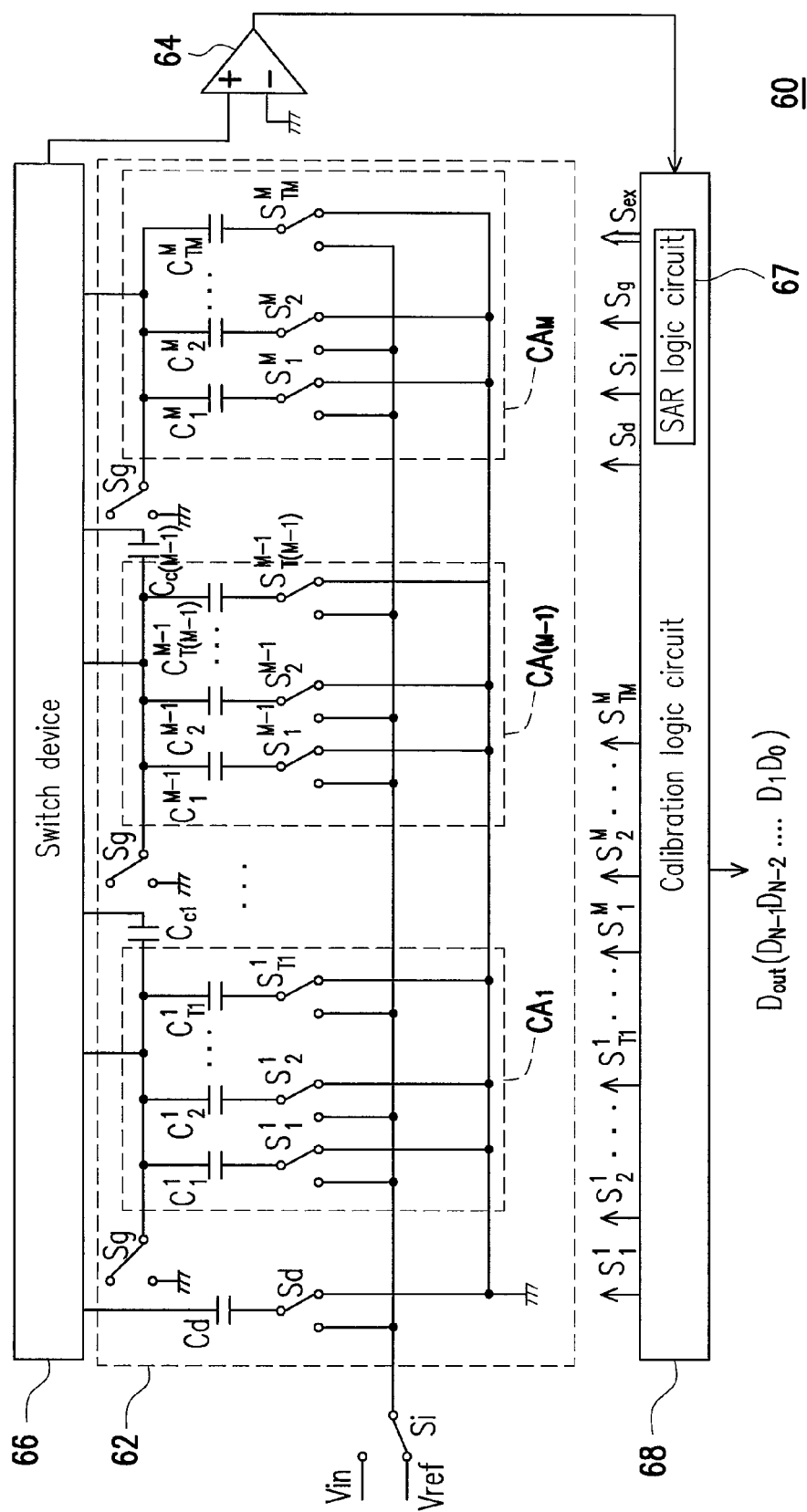
FIG. 4 is a simplified circuit diagram of an ADC according to an embodiment of the disclosure.

FIG. 4 is a simplified circuit diagram of an ADC according to an embodiment of the disclosure. Referring to FIG. 4, the ADC 60 includes a DAC 62, a comparator 64, a switch device 66 and a calibration logic circuit 68. The DAC 62 includes a reference capacitor $C_d$, M−1 bridge capacitors $C_{C1}$-$C_{C(M-1)}$ and N composed capacitors grouped into M capacitor groups $CA_1, \ldots, CA_M$, where the first capacitor group $CA_1$ includes T1 composed capacitors $C_1^1, C_2^1, \ldots, C_{T1}^1$, the second capacitor group $CA_2$ includes T2 composed capacitors $C_1^2, C_2^2, \ldots, C_{T2}^2$, and deduced by analogy, the $M^{th}$ capacitor group $CA_M$ includes TM composed capacitors $C_1^M, C_2^M, \ldots, C_{TM}^M$.

For example, in case of the 8-bit ADC of N=8, the DAC thereof may include the reference capacitor $C_d$, and 8 composed capacitors grouped into the capacitor group $CA_1$, the capacitor group $CA_2$ and the capacitor group $CA_3$, where the capacitor group $CA_1$ may include 4 composed capacitors $C_1^1, C_2^1, \ldots, C_4^1$, the capacitor group $CA_2$ includes 2 composed capacitors $C_1^2$ and $C_2^2$, and the capacitor group $CA_3$ includes 2 composed capacitors $C_1^3$ and $C_2^3$. The capacitor group $CA_1$ may also include 5 composed capacitors $C_1^1, C_2^1, \ldots, C_5^1$, the capacitor group $CA_2$ includes 1 composed capacitors $C_1^2$, and the capacitor group $CA_3$ includes 2 composed capacitors $C_1^3$ and $C_2^3$. The composed capacitors may also be grouped into 4 capacitor groups $CA_1$-$CA_4$, and each of the capacitor groups $CA_1$-$CA_4$ respectively includes 2 composed capacitors, and the grouping method of the composed capacitors is not limited by the disclosure. Each of the capacitors has a corresponding weighting value, and the weighting values of the capacitors can be interpreted as capacitance values.

Referring to FIG. 4, the capacitor 64 has a first input terminal, a second input terminal and an output terminal. The comparator 64 compares inputs of the first input terminal and the second input terminal, and outputs a comparison result through the output terminal. The switch device 66 is coupled to the reference capacitor $C_d$, at least one of the capacitor groups, at least one of the bridge capacitors $C_c$ and the comparator 64. Each of the aforementioned capacitors has a first end and a second end, and the first ends of all the composed capacitors in at least one of the capacitor groups are coupled to the switch device 66, and a first end of the reference capacitor $C_d$ is also coupled to the switch device 66. The switch device 66 can be used to switch coupling relations of the capacitor groups $CA_1$-$CA_M$ in the DAC. The switch device 66 can be a switch, a multiplexer, a logic circuit or a combination thereof, which is not limited by the disclosure.

The calibration logic circuit 68 is coupled to the DAC 62, the comparator 64 and the switch device 66. The calibration logic circuit 68 controls the switch device 66 to select at least one of the capacitor groups as a target group, and select at least one of the capacitor groups other than the target group as a reference group. Namely, the calibration logic circuit 68 controls the switch device 66 to select at least one of the capacitor groups $CA_1$-$CA_M$, for example, the capacitor group $CA_3$ and the capacitor group $CA_5$ as target groups, or only select the capacitor group $CA_{10}$ as a target group, which is not limited by the disclosure. The calibration logic circuit 68 uses the reference group to measure weighting codes of the composed capacitors in the target group, and calculates group weighting values of the composed capacitors in the target group according to the weighting codes, and obtains equivalent weighting values of the composed capacitors according to the group weighting values of the composed capacitors.

The calibration logic circuit 68 controls the switch device 66 to couple the target group to the comparator 64 and one end of one of the bridge capacitors $C_{c1}$-$C_{c(M-1)}$, and couple the other end of the bridge capacitor $C_c$ coupled to the target group to the reference group and the reference capacitor $C_d$. The calibration logic circuit 68 includes a successive approximation register (SAR) logic circuit 67. The SAR logic circuit 67 is coupled to the comparator 64 and the DAC 62, and the SAR logic circuit 67 selects an input value of all the composed capacitors $C_1^1$-$C_{TM}^M$ to be a first value $V_1$ or a second value $V_0$ according to the output of the comparator 64, so as to obtain the weighting codes $K_1^1$-$K_{TM}^M$ of the composed capacitors $C_1^1$-$C_{TM}^M$. In the present embodiment, the first value $V_1$ and the second value $V_0$ can be respectively voltage values VRT and VRB or voltage values $V_{ref}$ and 0, though the disclosure is not limited thereto.

Figure 5:
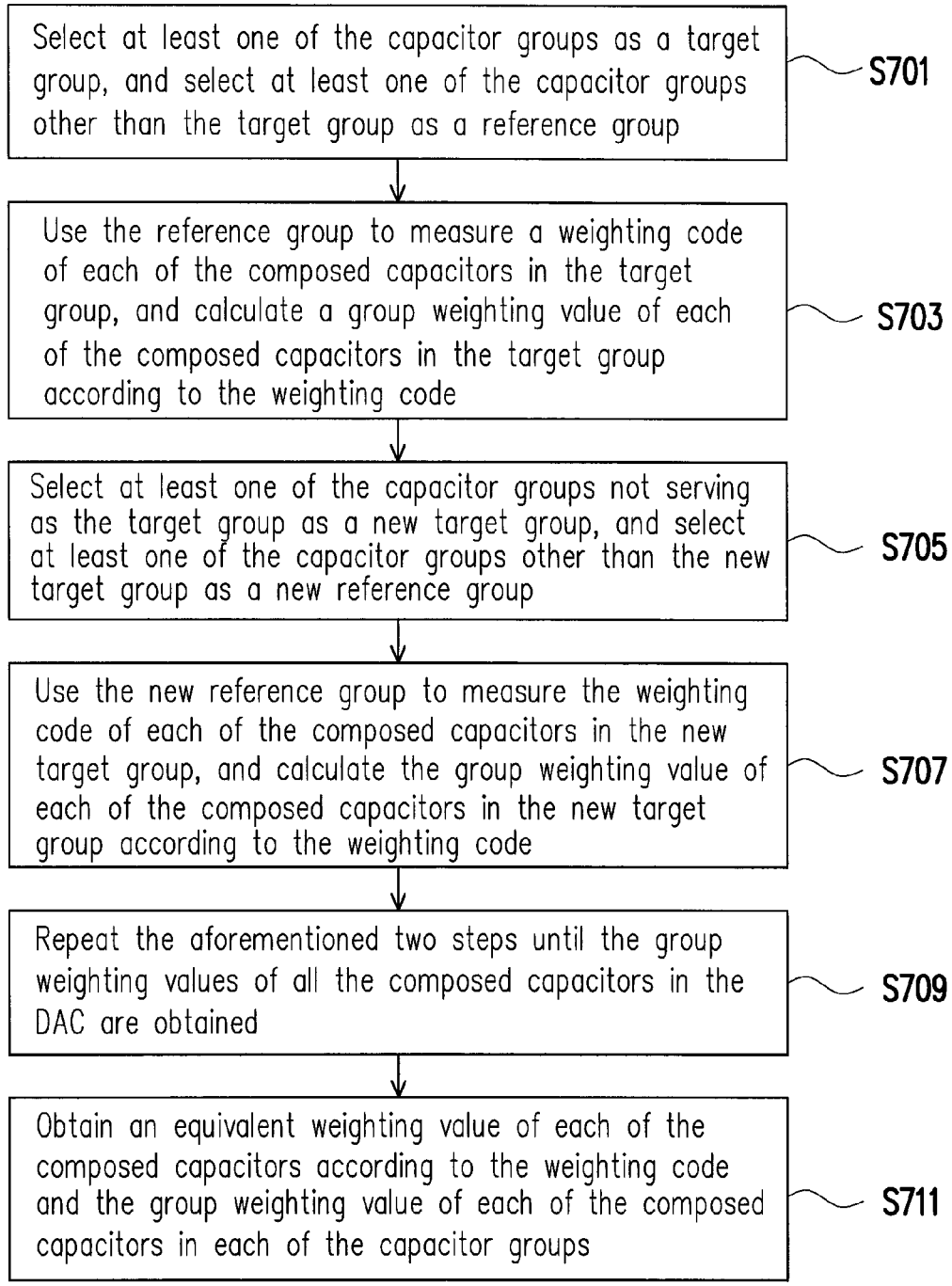
FIG. 5 is a flowchart illustrating a method for evaluating capacitor weighting according to an embodiment of the disclosure.

FIG. 5 is a flowchart illustrating a method for evaluating capacitor weighting according to an embodiment of the disclosure. Referring to FIG. 4 and FIG. 5, the method for evaluation capacitor weighting can be applied to the ADC 60 of FIG. 4. In step S701, at least one of the capacitor groups are selected as a target group, and at least one of the capacitor groups other than the target group are selected as a reference group. It should be noticed that one capacitor group $CA_1$ or other capacitor group in the capacitor groups $CA_1$-$CA_M$ can be selected as the target group, or a plurality of capacitor groups in the capacitor groups $CA_1$-$CA_M$ can be selected as the target groups, which is not limited by the disclosure.

In step S703, the reference group is used to measure a weighting code of each of the composed capacitors in the target group, and a group weighting value of each of the composed capacitors in the target group is calculated according to the weighting code. Detailed steps of evaluating the group weighting values are similar to that of the embodiment of FIG. 2, which can be deduced by those skilled in the art with reference of the aforementioned descriptions, so that details of the descriptions of the steps are not repeated. It should be noticed that the so-called successive approximation method in the embodiment of FIG. 2 is a binary-search method. Moreover, another so-called unary-search method is a search method decreasing/increasing monotonically from the maximum/minimum value, though the disclosure is not limited thereto.

In step S705, at least one of the capacitor groups not serving as the target group are selected as a new target group, and at least one of the capacitor groups other than the new target group are selected as a new reference group. Such step is intended to obtain the group weighting values $W_1^1$-$W_{TM}^M$ of all the composed capacitors $C_1^1$-$C_{TM}^M$ in the capacitor groups $CA_1$-$CA_M$, so that the switch device 66 can be used to switch coupling relations of the capacitor groups $CA_1$-$CA_M$ to change the target group and the reference group.

Therefore, in step S707, the new reference group is used to measure the weighting code of each of the composed capacitors in the new target group, and the group weighting value of each of the composed capacitors in the new target group is calculated according to the weighting code. Detailed steps of evaluating the group weighting values are similar to that of the embodiment of FIG. 2, which are not repeated. In step S709, the aforementioned two steps (the step S705 and the step S707) are repeated until the group weighting values $W_1^1$-$W_{TM}^M$ of all the composed capacitors $C_1^1$-$C_{TM}^M$ in the DAC 62 are obtained. In the method of the disclosure, one or a plurality of capacitor groups are taken as reference groups having reference weighting values to measure the equivalent weighting values of the composed capacitors in another capacitor group. The other capacitor group combination (one or plural) is used to perform weight measurement on the capacitor group that is previously taken as the reference group. According to the interactive measuring method of the capacitor groups, the equivalent weighting values of all the capacitor elements are calculated one-by-one.

In step S711, an equivalent weighting value of each of the composed capacitors is obtained according to the weighting code and the group weighting value of each of the composed capacitors in each of the capacitor groups. For example, the target group selected at any round is defined as an O group, and the corresponding reference group is defined as a P group, where the O group includes V composed comparators, and V is a positive integer greater than or equal to 1 and is smaller than or equal to N−(M−1). A group weighting value of an $(i+1)^{th}$ composed capacitor in the O group is calculated according to a weighting code $K_{i+1}$ of the $(i+1)^{th}$ composed capacitor in the O group and the group weighting values of the first, the second, . . . , the $i^{th}$ composed capacitors in the O group and the group weighting values of all the composed capacitors in the P group, where i is a positive integer greater than or equal to 1 and is smaller than or equal to V. The step S711 can be repeated by R times, where R is a positive integer greater than or equal to 1. The ADC obtains a calibrated digital output value through calculation according to the equivalent weighting values obtained after evaluation and a successive approximation result of each input signal, such that a conversion function between the analog input and the digital output of the ADC present a linear relationship.

Figure 6:
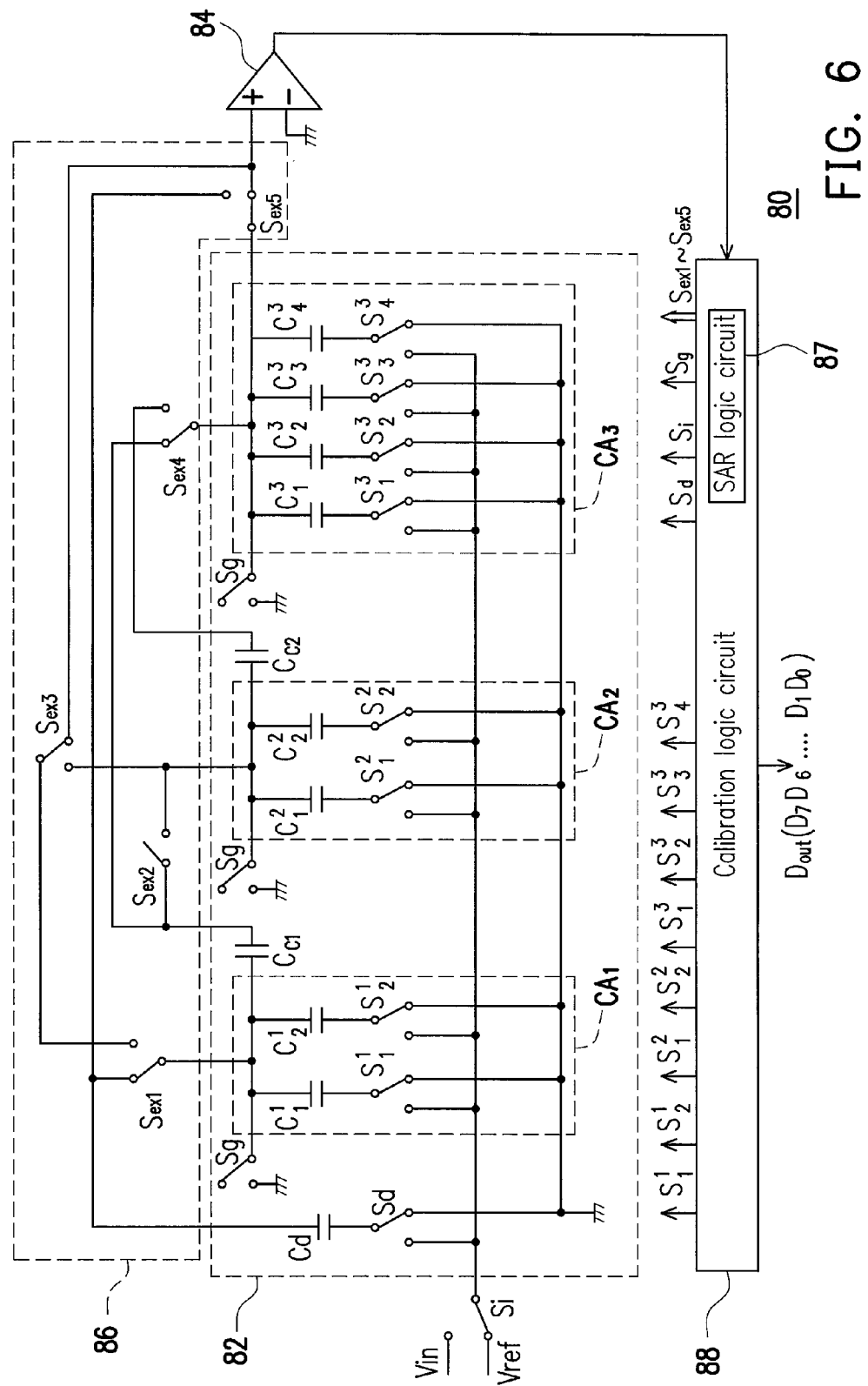
FIG. 6 is a simplified circuit diagram of an 8-bit ADC according to an embodiment of the disclosure.

In order to clearly describe the disclosure, another 8-bit SCA SAR ADC is taken as an example to describe how to evaluate the weighting values of the composed capacitors. FIG. 6 is a simplified circuit diagram of an 8-bit ADC 80 according to an embodiment of the disclosure. The ADC 80 includes a DAC 82, a comparator 84, a switch device 86 and a calibration logic circuit 88. The DAC 82 includes a reference capacitor $C_d$, bridge capacitors $C_{C1}$ and $C_{C2}$ and 8 composed capacitors grouped into 3 capacitor groups $CA_1$, $CA_2$, $CA_3$, where the capacitor group $CA_1$ includes 2 composed capacitors $C_1^1$ and $C_2^1$, the capacitor group $CA_2$ includes 2 composed capacitors $C_1^2$ and $C_2^2$, and the capacitor group $CA_3$ includes 4 composed capacitors $C_1^3, C_2^3, C_3^3, C_4^3$. The bridge capacitors $C_{C1}$ and $C_{C2}$ are used to connect the capacitor group $CA_1$, the capacitor group $CA_2$ and the capacitor group $CA_3$. The coupling relations and functions of the aforementioned various components are the same or similar to that of the embodiment of FIG. 4, which are not repeated. It should be noticed that as shown in FIG. 6, the switch device 86 of the present embodiment is composed of 5 switches $S_{ex1}$-$S_{ex5}$.

In the present embodiment, it is assumed that the reference voltage $V_{ref}$ is equal to 1V, the capacitance values of the bridge capacitors $C_{C1}$ and $C_{C2}$ are equal to 2C, the capacitance value of the reference capacitor $C_d$ is equal to 1C, and real capacitance values of the composed capacitors and ratios between the composed capacitors are shown in a following table 6.

TABLE 6

| Capacitor | Capacitance value | Real capacitance weighting ratio |
|---|---|---|
| $C_1^1$ | 1 C | 1 |
| $C_2^1$ | 1.9 C | 1.9 |
| $C_1^2$ | 1 C | 2.8 |
| $C_2^2$ | 2.1 C | 5.9 |
| $C_1^3$ | 1 C | 7.8 |
| $C_2^3$ | 1.9 C | 14.7 |
| $C_3^3$ | 3.6 C | 27.7 |
| $C_4^3$ | 7.1 C | 54.7 |

In the present embodiment, by switching the switches $S_{ex1}$-$S_{ex5}$ in the switch device 86, at least one of the capacitor groups $CA_1$, $CA_2$, $CA_3$ are selected as the target group and at least one of the capacitor groups $CA_1$, $CA_2$, $CA_3$ are selected as the reference group. For example, the capacitor group $CA_1$ can be used to measure the capacitor group $CA_2$, or the reference group composed of the capacitor group $CA_1$ and the capacitor group $CA_2$ can be used to measure the capacitor group $CA_3$, or the capacitor group $CA_3$ can be used to measure the capacitor group $CA_1$, which is not limited by the disclosure.

It is assumed that the capacitor group $CA_3$ is selected as the target group, and the capacitor group $CA_1$ and the capacitor group $CA_2$ are selected as the reference group. In other words, the capacitor group $CA_1$ and the capacitor group $CA_2$ are used to measure the capacitor group $CA_3$. First, the composed capacitor $C_1^3$ representing the lowest bit in the capacitor group $CA_3$ is first measured. In the present exemplary embodiment, after the successive approximation operation, an obtained result indicates that the voltage generated by turning on the switch $S_2^1$ and the switch $S_2^2$ can make the voltage used for charging the composed capacitor $C_1^3$ in the beginning to approach to 0. Namely, the composed capacitor $C_1^3$ in the capacitor group $CA_3$ is regarded to be equivalent to the composed capacitor $C_2^1$ of the capacitor group $CA_1$ and the composed capacitor $C_2^2$ of the capacitor group $CA_2$. The weighting code $K_1^3$ of the composed capacitor $C_1^3$ can be represented by [1010]. Each bit of the weighting code $K_1^3$ may represent a conducting state of the switches $S_2^2, S_1^2, S_2^1$ and $S_1^1$. Then, the composed capacitors of the capacitor group $CA_3$ are measured according to the same method. The measuring method between the capacitor groups and the method of obtaining the group weighting values can refer to the embodiments of FIG. 1-FIG. 5, and details thereof are not repeated. It is assumed that the weighting codes $K_1^3$-$K_4^3$ and the group weighting values $W_1^3$-$W_4^3$ of the composed capacitors $C_1^3$-$C_4^3$ in the capacitor group $CA_3$ obtained according to the method of the disclosure are shown in a following table 7, though the table 7 is not used to limit the disclosure.

TABLE 7

| Capacitor | Weighting code | Group weighting value |
|---|---|---|
| $C_1^3$ | $K_1^3$ = [1010] | $W_1^3$ = 10 |
| $C_2^3$ | $K_2^3$ = [1-1001] | $W_2^3$ = 10 + 9 = 19 |
| $C_3^3$ | $K_3^3$ = [11-0110] | $W_3^3$ = 19 + 10 + 6 = 35 |
| $C_4^3$ | $K_4^3$ = [110-0101] | $W_4^3$ = 35 + 19 + 5 = 69 |

After the weighting codes $K_1^3$-$K_4^3$ and the group weighting values $W_1^3$-$W_4^3$ of the composed capacitors $C_1^3$-$C_4^3$ in the capacitor group $CA_3$ are obtained, the switch device 86 can be switched to respectively select the capacitor group $CA_1$ and the capacitor group $CA_2$ as the target group, and select the capacitor group $CA_3$ as the reference group. In brief, the capacitor group $CA_3$ is used to respectively measure the capacitor group $CA_1$ and the capacitor group $CA_2$ to obtain the group weighting values $W_1^1$ and $W_2^1$ of the composed capacitors $C_1^1$ and $C_2^1$ and obtain the group weighting values $W_1^2$ and $W_2^2$ of the composed capacitors $C_1^2$ and $C_2^2$, as that shown in a following table 8.

TABLE 8

| Capacitor | Weighting code | Group weighting value |
|---|---|---|
| $C_1^1$ | $K_1^1$ = [1001] | $W_1^1$ = 69 + 10 = 79 |
| $C_2^1$ | $K_2^1$ = [1-0111] | $W_2^1$ = 79 + 35 + 19 + 10 = 143 |
| $C_1^2$ | $K_1^2$ = [1001] | $W_3^1$ = 69 + 10 = 79 |
| $C_2^2$ | $K_2^2$ = [1-1001] | $W_4^1$ = 79 + 10 + 69 = 158 |

After the weighting codes $K_1^1, K_2^1, K_1^2, K_2^2, K_1^3$-$K_4^3$ and the group weighting values $W_1^1, W_2^1, W_1^2, W_2^2, W_1^3$-$W_4^3$ of the composed capacitors $C_1^1, C_2^1, C_1^2, C_2^2, C_1^3$-$C_4^3$ are obtained, the equivalent weighting values $W'_1{}^1, W'_2{}^1, W'_1{}^2, W'_2{}^2, W'_1{}^3$-$W'_4{}^3$ of the composed capacitors $C_1^1, C_2^1, C_1^2, C_2^2, C_1^3$-$C_4^3$ are obtained according to the weighting codes $K_1^1, K_2^1, K_1^2, K_2^2, K_1^3$-$K_4^3$ and the group weighting values $W_1^1, W_2^1, W_1^2, W_2^2, W_1^3$-$W_4^3$ of the composed capacitors in each of the capacitor groups $CA_1$-$CA_3$, as that shown in table 9. The capacitor group $CA_3$ can be used to measure the target group composed of the capacitor group $CA_1$ and the capacitor group $CA_2$. Therefore, the selection manner of the target group and the reference group is very flexible, the above contents are only an exemplary embodiment, which are not used to limit the disclosure. In this way, the equivalent weighting values of the composed capacitors $C_1^1, C_2^1, C_1^2, C_2^2, C_1^3$-$C_4^3$ in the DAC 82 can be evaluated according to the method provided by the disclosure.

TABLE 9

| Capacitor | Weighting code | Equivalent weighting value |
|---|---|---|
| $C_1^1$ | $K_1^1 = [1000]$ | $W'_1{}^1 = 79$ |
| $C_2^1$ | $K_2^1 = [1\text{-}1000]$ | $W'_2{}^1 = 143$ |
| $C_1^2$ | $K_1^2 = [1001]$ | $W'_1{}^2 = 234$ |
| $C_2^2$ | $K_2^2 = [1\text{-}1001]$ | $W'_2{}^2 = 468$ |
| $C_1^3$ | $K_1^3 = [1010]$ | $W'_1{}^3 = 468 + 143 = 611$ |
| $C_2^3$ | $K_2^3 = [1\text{-}1001]$ | $W'_2{}^3 = 611 + 468 + 79 = 1158$ |
| $C_3^3$ | $K_3^3 = [11\text{-}0110]$ | $W'_3{}^3 = 1158 + 611 + 143 + 243 = 2146$ |
| $C_4^3$ | $K_4^3 = [111\text{-}0101]$ | $W'_4{}^3 = 2146 + 1158 + 611 + 234 + 79 = 4228$ |

According to the exemplary embodiment method provided by the disclosure, the equivalent weighting values of the composed capacitors in the DAC 82 can be evaluated, and the real weighting ratios of the composed capacitors in the DAC 82 can be evaluated. According to a following table 10, it is known that the evaluated capacitor weighting ratios are very close to the real weighting ratios, which represents that the real weighting ratios of the capacitors can be accurately evaluated according to the measuring method of the disclosure, so as to decrease the adverse effects caused by capacitor mismatch, and ameliorate conversion linearity of the ADC.

TABLE 10

| Capacitor | Equivalent weighting value | Evaluated capacitor weighting ratio | Real capacitor weighting ratio |
|---|---|---|---|
| $C_1^1$ | $W'_1{}^1 = 79$ | 1 | 1 |
| $C_2^1$ | $W'_2{}^1 = 143$ | 1.8 | 1.9 |
| $C_1^2$ | $W'_1{}^2 = 234$ | 3.0 | 2.8 |
| $C_2^2$ | $W'_2{}^2 = 468$ | 5.9 | 5.9 |
| $C_1^3$ | $W'_1{}^3 = 611$ | 7.7 | 7.8 |
| $C_2^3$ | $W'_2{}^3 = 1158$ | 14.7 | 14.7 |
| $C_3^3$ | $W'_3{}^3 = 2146$ | 27.1 | 27.7 |
| $C_4^3$ | $W'_4{}^3 = 4228$ | 53.5 | 54.7 |

The real weighting ratios of the capacitors are accurately evaluated according to the measuring method of the disclosure, the evaluated weighting values can be used to calibrate the output codes. In detail, regarding a DAC with output data of $D_{out} = (d_{N-1} d_{N-2} \ldots d_0)$, due to the capacitor mismatch, the output digital data and the input voltage of the DAC have a non-linear relationship. However, after the weighting ratios of the composed capacitors are obtained according to the measuring method of the disclosure, a following equation (1) can be used to calibrate the output digital data of the DAC.

$$D^* = \frac{\sum_{i=0}^{N-1} W_i d_i}{\sum_{i=0}^{N-1} W_i} (2^H - 1) \quad (1)$$

Where, $W_i$ is an equivalent weighting value of each of the composed capacitors obtained according to the measuring method of the disclosure. H is a resolution of the ADC, and N is a number of the composed capacitors in the ADC. Generally, H is smaller than or equal to N. In case of the equivalent weighting values of the composed capacitors that are not obtained, $W_i$ is equal to $r^i$, where r is an ideal ratio value of each of the composed capacitors. By using the equivalent weighting value that is closer to replace the ideal ratio value, a calibrated digital output is obtained. Since the equivalent weighting values of the composed capacitors can be accurately evaluated according to the measuring method of the disclosure, the conversion linearity of the ADC can be enhanced by calibrating the equivalent weighting values of the composed capacitors.

Figure 7:
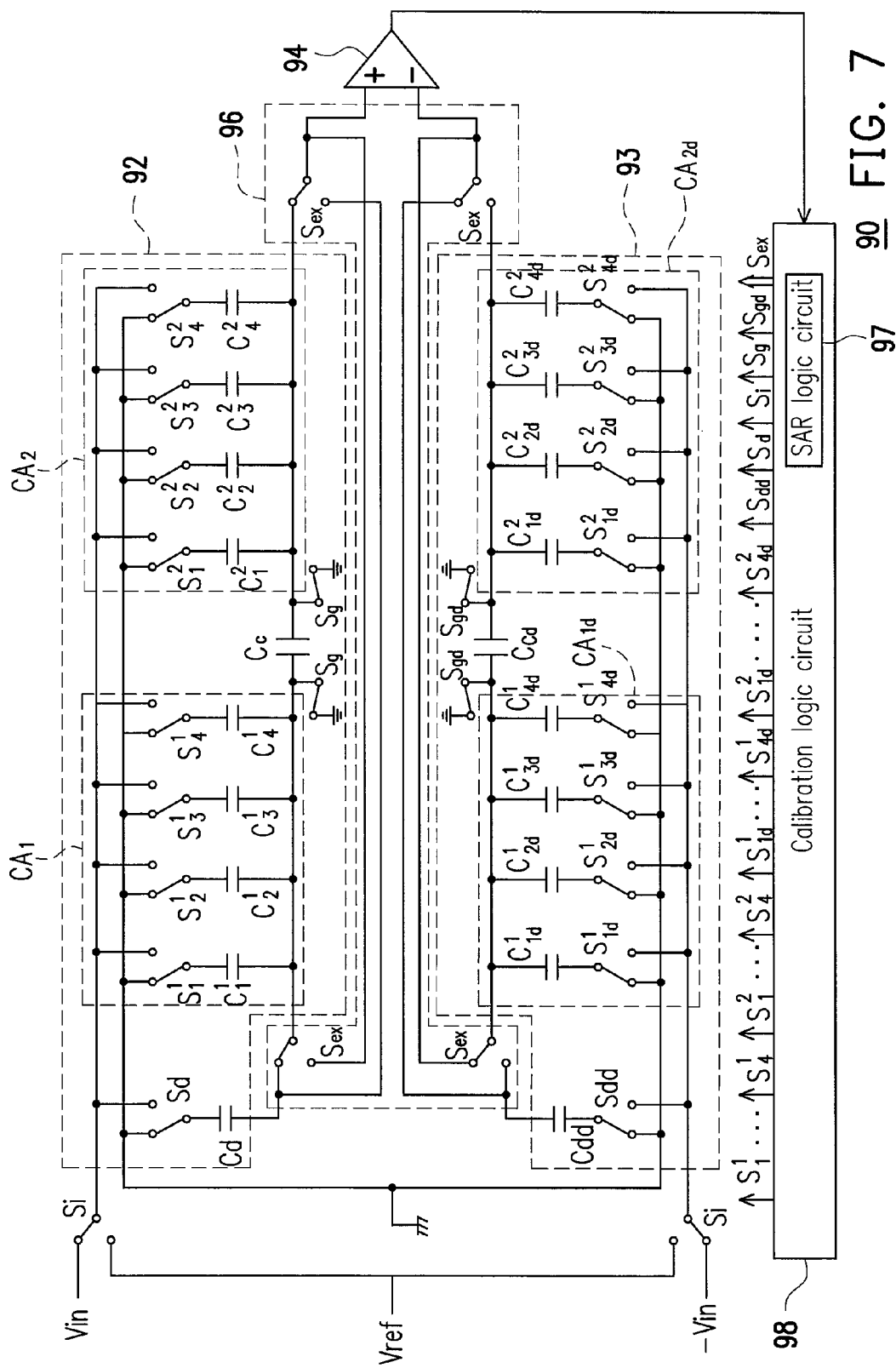
FIG. 7 is a simplified circuit diagram of an ADC according to an embodiment of the disclosure.

Moreover, implementations of the disclosure are not limited to the aforementioned embodiments, and the aforementioned embodiments can be suitably modified according to an actual demand. For example, the method for evaluating capacitor weighting provided by the disclosure can also be applied to a SAR ADC of a differential structure. FIG. 7 is a simplified circuit diagram of an ADC 90 according to an embodiment of the disclosure. The ADC 90 includes a DAC 92, a comparator 94, a switch device 96 and a calibration logic circuit 98. The DAC 92 includes a reference capacitor $C_d$, a bridge capacitors $C_C$ and 8 composed capacitors grouped into 2 capacitor groups $CA_1$ and $CA_2$, where the capacitor group $CA_1$ includes 4 composed capacitors $C_1^1$-$C_4^1$, and the capacitor group $CA_2$ includes 4 composed capacitors $C_1^2$-$C_4^2$. The bridge capacitors $C_C$ is used to connect the capacitor group $CA_1$ and the capacitor group $CA_2$. The coupling relations and functions of the aforementioned various components are the same or similar to that of the embodiment of FIG. 3, which are not repeated. It should be noticed that as shown in FIG. 7, the ADC 90 of the present embodiment further includes a DAC 93, where the DAC 93 is coupled to another input terminal of the comparator 94 and the switch device 96. Therefore, the ADC 90 is a differential type SAR ADC.

The DAC 93 includes a reference capacitor $C_{dd}$, a bridge capacitors $C_{Cd}$ and 8 composed capacitors grouped into 2 capacitor groups $CA_{1d}$ and $CA_{2d}$, where the capacitor group $CA_{1d}$ includes 4 composed capacitors $C_{1d}^1$-$C_{4d}^1$, and the capacitor group $CA_{2d}$ includes 4 composed capacitors $C_{1d}^2$-$C_{4d}^2$. The bridge capacitors $C_{Cd}$ is used to connect the capacitor group $CA_{1d}$ and the capacitor group $CA_{2d}$. In the present embodiment, coupling relations and functions of various components of the DAC 93 are similar to that of the DAC 92. The DAC 92 and the DAC 93 have a same structure, and are respectively coupled to the two input terminals of the comparator 94.

Similarly, regardless of the DAC 92 or the DAC 93, the weighting values of each of the capacitors can be evaluated according to the switch operation of the switch device 96 and the calculation method of the disclosure. The method for evaluating the weighting values of each of the composed capacitors can refer to the embodiments of FIG. 1 to FIG. 6, and details thereof are not repeated. It should be noticed that besides the capacitor weighting values of the DAC 92 and the DAC 93 can be respectively obtained according to the method provided by the disclosure, equivalent weighting values of linkage capacitor pairs composed of the composed capacitors in the DAC 92 and the corresponding composed capacitors in the DAC 93 can also be directly obtained. In detail, regarding the differential type SAR ADC, the capacitor groups of the DAC 92 and the capacitor groups of the DAC 93 are linked. Therefore, in the differential pair, the bit capacitance values of the corresponding composed capacitors in the DAC 92 and the DAC 93 are considered together. For example, regarding the equivalent weighting value used for calibrating a first bit of the output code, ratios of the composed capacitors $C_1^1$ and $C_{1d}^1$ relative to the other composed capacitors are simultaneously considered. In analog-to-digital conversion operations, weighting ratios of the capacitors in the DAC 92 and the DAC 93 and the linked equivalent weighting ratios of the corresponding composed capacitors in the two DACs can be evaluated according to the evaluation method of the disclosure. Therefore, the capacitor weighting values can be used to calibrate the digital data generated through a SAR operation, so as to enhance the conversion linearity of the input voltage and the output digital data of the ADC 90.

In summary, in the SAR ADC of the disclosure, the demand on a relative matching degree of the composed elements of the DAC is eliminated to decrease a whole area and power consumption of the SAR ADC, and decrease a demand on driving capability of the DAC driving circuit. In a system application requiring an ADC array, for example, parallel processing analog front-end of image sensor, or analog front-end of an ultrasonic image system, etc., the low power consumption and small area ADC IP avails circuit integration, i.e. more front-end channels are integrated in a single chip, which avails reducing the system cost or development of portable system.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A method for evaluating capacitor weighting of a digital-to-analog converter comprising:
    selecting at least one of capacitor groups as a target group, and selecting at least one of the capacitor groups other than the target group as a reference group;
    using the reference group to measure a weighting code of each of the composed capacitors in the target group, and calculating a group weighting value of each of the composed capacitors in the target group according to the weighting code;
    selecting at least one of the capacitor groups not serving as the target group as a new target group, and selecting at least one of the capacitor groups other than the new target group as a new reference group;
    using the new reference group to measure the weighting code of each of the composed capacitors in the new target group, and calculating the group weighting value of each of the composed capacitors in the new target group according to the weighting code;
    repeating the aforementioned two steps until the group weighting values of all the composed capacitors in the digital-to-analog converter are obtained; and
    obtaining an equivalent weighting value of each of the composed capacitors according to the weighting code and the group weighting value of each of the composed capacitors in each of the capacitor groups.

2. The method for evaluating capacitor weighting of the digital-to-analog converter as claimed in claim 1, wherein the digital-to-analog converter comprises N composed capacitors grouped into M capacitor groups and M-1 bridge capacitors, wherein N is an integer greater than 1, and M is an integer greater than or equal to 2 and is smaller than or equal to N.

3. The method for evaluating capacitor weighting of the digital-to-analog converter as claimed in claim 2, wherein the target group comprises T composed capacitors, wherein T is a positive integer greater than or equal to 1 and is smaller than or equal to N-(M-1), and the step of using the reference group to measure the weighting code of each of the composed capacitors in the target group comprises:
    in a first mode, inputting a first value V1 to an $i^{th}$ composed capacitor Ei in the target group, and inputting a second value V0 to other composed capacitors; and
    in a second mode, inputting the second value V0 to the $i^{th}$ composed capacitor Ei in the target group, inputting the first value V1 to at least one of the composed capacitors in the reference group, and inputting the first value V1 to at least one of the composed capacitors in the target group other than the composed capacitor, such that an output of the digital-to-analog converter in the first mode approaches to an output of the digital-to-analog converter in the second mode, and obtaining the weighting code K, of the $i^{th}$ composed capacitor in the target group relative to the reference group according to the input value of each of the composed capacitors in the reference group and the input value of the composed capacitors in the target group other than the $i^{th}$ composed capacitor, wherein i is a positive integer greater than or equal to 1 and is smaller than or equal to T.

4. The method for evaluating capacitor weighting of the digital-to-analog converter as claimed in claim 2, wherein the target group comprises T composed capacitors, wherein T is a positive integer greater than or equal to 1 and is smaller than or equal to N-(M-1), and the step of calculating the group weighting value of each of the composed capacitors according to the weighting code comprises:
    calculating the group weighting value of an (i+1)th composed capacitor in the target group according to the weighting code Ki+1 of the (i+1)th composed capacitor in the target group and the group weighting values of the first, the second, . . . , and the ith composed capacitors in the target group, wherein i is a positive integer greater than or equal to 1 and is smaller than or equal to T.

5. The method for evaluating capacitor weighting of the digital-to-analog converter as claimed in claim 2, wherein the target group selected at any round is defined as an O group, and the corresponding reference group is defined as a P group, wherein the O group comprises V composed comparators, and V is a positive integer greater than or equal to 1 and is smaller than or equal to N-(M-1), and the step of obtaining the equivalent weighting value of each of the composed capacitors according to the weighting code and the group weighting value of each of the composed capacitors in each of the capacitor groups comprises:
    obtaining the equivalent weighting value of an (i+1)th composed capacitor in the O group according to the weighting code Ki+1 of the (i+1)th composed capacitor in the O group and the group weighting values of the first, the second, . . . , and the ith composed capacitors in the O group and the group weighting values of all the composed capacitors in the P group, wherein i is a positive integer greater than or equal to 1 and is smaller than or equal to V; and repeating the aforementioned step by R times, wherein R is a positive integer greater than or equal to 1.

6. An analog-to-digital converter, comprising:
a digital-to-analog converter, comprising:
   a reference capacitor;
   N composed capacitors, grouped into M capacitor groups; and
   M-1 bridge capacitors, connecting each of the capacitor groups;
a comparator, having a first input terminal, a second input terminal and an output terminal, comparing inputs of the first input terminal and the second input terminal, and outputting a comparison result through the output terminal;
a switch device, coupled to the reference capacitor, at least one of the capacitor groups, at least one of the bridge capacitors and the comparator; and
a calibration logic circuit, coupled to the digital-to-analog converter, the comparator and the switch device, controlling the switch device to select at least one of the capacitor groups as a target group, and select at least one of the capacitor groups other than the target group as a reference group, using the reference group to measure a weighting code of each of the composed capacitors in the target group, calculating a group weighting value of each of the composed capacitors in the target group according to the weighting code, and obtaining an equivalent weighting value of each of the composed capacitors according to the group weighting value of each of the composed capacitors.

7. The analog-to-digital converter as claimed in claim 6, wherein N is an integer greater than 1, and M is a positive integer greater than or equal to 2 and is smaller than or equal to N.

8. The analog-to-digital converter as claimed in claim 7, wherein the calibration logic circuit controls the switch device to couple the target group to the comparator and one end of one of the bridge capacitors, and couple the other end of the bridge capacitor coupled to the target group to the reference group and the reference capacitor.

9. The analog-to-digital converter as claimed in claim 7, wherein the calibration logic circuit comprises:
   a successive approximation register logic circuit, coupled to the comparator and the digital-to-analog converter, and selecting an input value of all the composed capacitors to be one of a first value V1 and a second value V0 according to the output of the comparator, so as to obtain the weighting codes of the composed capacitors.

10. The analog-to-digital converter as claimed in claim 9, wherein the target group comprises T composed capacitors, and T is a positive integer greater than or equal to 1 and is smaller than or equal to N-(M-1), wherein:
   in a first mode, a first value V1 in input to an $i^{th}$ composed capacitor Ei in the target group, and a second value V0 is input to other composed capacitors; and
   in a second mode, the second value V0 is input to the $i^{th}$ composed capacitor Ei in the target group, the first value V1 is input to at least one of the composed capacitors in the reference group, and the first value V1 is input to at least one of the composed capacitors in the target group other than the $i^{th}$ composed capacitor, such that an output of the digital-to-analog converter in the first mode approaches to an output of the digital-to-analog converter in the second mode, and the weighting code $K_i$ of the $i^{th}$ composed capacitor in the target group relative to the reference group is obtained according to the input value of each of the composed capacitors in the reference group and the input value of the composed capacitors in the target group other than the $i^{th}$ composed capacitor, wherein i is a positive integer greater than or equal to 1 and is smaller than or equal to T.

11. The analog-to-digital converter as claimed in claim 7, wherein the target group comprises T composed capacitors, and T is a positive integer greater than or equal to 1 and is smaller than or equal to N-(M-1), wherein:
   the calibrate logic circuit calculates the group weighting value of an $(i+1)^{th}$ composed capacitor in the target group according to the weighting code $K_{i+1}$ of the $(i+1)^{th}$ composed capacitor in the target group and the group weighting values of the first, the second, ..., and the $i^{th}$ composed capacitors in the target group, wherein i is a positive integer greater than or equal to 1 and is smaller than or equal to T.

12. The analog-to-digital converter as claimed in claim 7, wherein
   the target group selected at any round is defined as an O group, and the corresponding reference group is defined as a P group, the O group comprises V composed comparators, and V is a positive integer greater than or equal to 1 and is smaller than or equal to N-(M-1), wherein:
   the calibration logic circuit obtains the equivalent weighting value of an $(i+1)^{th}$ composed capacitor in the O group according to the weighting code $K_{i+1}$ of the $(i+1)^{th}$ composed capacitor in the O group and the group weighting values of the first, the second, ..., and the $i^{th}$ composed capacitors in the O group and the group weighting values of all the composed capacitors in the P group, wherein i is a positive integer greater than or equal to 1 and is smaller than or equal to V.

13. A method for evaluating capacitor weighting of a digital-to-analog converter comprising:
   using a first capacitor group to measure a weighting code of each of the composed capacitors in a second capacitor group, and calculating a group weighting value of each of the composed capacitors in the second capacitor group according to the weighting code;
   using the second capacitor group to measure the weighting code of each of the composed capacitors in the first capacitor group, and calculating the group weighting value of each of the composed capacitors in the first capacitor group according to the weighting code; and
   obtaining an equivalent weighting value of each of the composed capacitors according to the weighting code and the group weighting value of each of the composed capacitors in the first capacitor group and the second capacitor group,
   wherein the digital-to-analog converter comprises a bridge capacitor and N composed capacitors grouped into the first capacitor group and the second capacitor group, wherein N is an integer greater than 1.

14. The method for evaluating capacitor weighting of the digital-to-analog converter as claimed in claim 13, wherein the first capacitor group or the second capacitor group comprises T composed capacitors, T is a positive integer greater than or equal to 1 and is smaller than or equal to N-(M-1), and the step of using the first capacitor group to measure the weighting code of each of the composed capacitors in the second capacitor group, and using the second capacitor group to measure the weighting code of each of the composed capacitors in the first capacitor group comprises:
   in a first mode, inputting a first value V1 to an $i^{th}$ composed capacitor Ei of the first capacitor group or the second capacitor group of itself, and inputting a second value V0 to other composed capacitors; and in a second mode, inputting the second value V0 to the $i^{th}$ composed capacitor Ei of the first capacitor group or the second capacitor group of itself, inputting the first value V1 to at least one of the composed capacitors of the first capacitor group or the second capacitor group of counterpart, and inputting the first value V1 to at least one of the composed capacitors of the first capacitor group or the second capacitor group of itself other than the $i^{th}$ composed capacitor, such that an output of the digital-to-analog converter in the first mode approaches to an output of the digital-to-analog converter in the second mode, and obtaining the weighting code $K_i$ of the $i^{th}$ composed capacitor of the first capacitor group or the second capacitor group of itself relative to the first capacitor group or the second capacitor group of counterpart according to the input value of each of the composed capacitors of the first capacitor group or the second capacitor group of counterpart and the input value of the composed capacitors of the first capacitor group or the second capacitor group of itself other than the $i^{th}$ composed capacitor, wherein i is a positive integer greater than or equal to 1 and is smaller than or equal to T.

15. The method for evaluating capacitor weighting of the digital-to-analog converter as claimed in claim 13, wherein the first capacitor group or the second capacitor group comprises T composed capacitors, T is a positive integer greater than or equal to 1 and is smaller than or equal to N-1, and the step of calculating the group weighting value of each of the composed capacitors of the first capacitor group or the second capacitor group according to the weighting code comprises:

calculating the group weighting value of an $(i+1)^{th}$ composed capacitor of the first capacitor group or the second capacitor group of itself according to the weighting code $K_{i+1}$ of the $(i+1)^{th}$ composed capacitor of the first capacitor group or the second capacitor group of itself and the group weighting values of the first, the second, . . . , and the $i^{th}$ composed capacitors of the first capacitor group or the second capacitor group of itself, wherein i is a positive integer greater than or equal to 1 and is smaller than or equal to T.

16. The method for evaluating capacitor weighting of the digital-to-analog converter as claimed in claim 13, wherein the first capacitor group comprises U composed capacitors, and the second capacitor group comprises V composed capacitors, U is a positive integer greater than or equal to 1 and is smaller than or equal to N-1, V is equal to N-U, and the step of obtaining the equivalent weighting value of each of the composed capacitors according to the weighting code and the group weighting value of each of the composed capacitors in the first capacitor group and the second capacitor group comprises:

calculating the equivalent weighting value of an $(i+1)^{th}$ composed capacitor of the second capacitor group according to the weighting code $K_{i+1}$ of the $(i+1)^{th}$ composed capacitor of the second capacitor group, the group weighting values of the first, the second, . . . , the $i^{th}$ composed capacitors of the second capacitor group and the group weighting values of the first, the second, . . . , the $U^{th}$ composed capacitors of the first capacitor group, or calculating the equivalent weighting value of a $(j+1)^{th}$ composed capacitor of the first capacitor group according to the weighting code $K_{j+1}$ of the $(j+1)^{th}$ composed capacitor of the first capacitor group, the group weighting values of the first, the second, . . . , the $j^{th}$ composed capacitors of the first capacitor group and the group weighting values of the first, the second, . . . , the $V^{th}$ composed capacitors of the second capacitor group, wherein i is a positive integer greater than or equal to 1 and is smaller than or equal to V, and j is a positive integer greater than or equal to 1 and is smaller than or equal to U; and repeating the aforementioned step by R times, wherein R is a positive integer greater than or equal to 1.

17. An analog-to-digital converter, comprising:
a digital-to-analog converter, comprising:
   a reference capacitor;
   N composed capacitors, grouped into a first capacitor group and a second capacitor group; and
   a bridge capacitor, connecting the first capacitor group and the second capacitor group;
a comparator, having a first input terminal, a second input terminal and an output terminal, comparing inputs of the first input terminal and the second input terminal, and outputting a comparison result through the output terminal;
a switch device, coupled to the reference capacitor, the first capacitor group, the second capacitor group and the comparator; and
a calibration logic circuit, coupled to the digital-to-analog converter, the comparator and the switch device, controlling the switch device to use the first capacitor group to measure a weighting code of each of the composed capacitors in the second capacitor group, calculating a group weighting value of each of the composed capacitors in the second capacitor group according to the weighting code, using the second capacitor group to measure a weighting code of each of the composed capacitors in the first capacitor group, calculating a group weighting value of each of the composed capacitors in the first capacitor group according to the weighting code, and obtaining an equivalent weighting value of each of the composed capacitors according to the weighting code and the group weighting value of each of the composed capacitors.

18. The analog-to-digital converter as claimed in claim 17, wherein the calibration logic circuit controls the switch device to couple the first capacitor group or the second capacitor group to the comparator and one end of the bridge capacitor, and couple the other end of the bridge capacitor to the second capacitor group or the first capacitor group and the reference capacitor.

19. The analog-to-digital converter as claimed in claim 17, wherein the calibration logic circuit comprises:
   a successive approximation register logic circuit, coupled to the comparator and the digital-to-analog converter, and selecting an input value of all the composed capacitors to be one of a first value V1 and a second value V0 according to the output of the comparator, so as to obtain the weighting codes of the composed capacitors.

20. The analog-to-digital converter as claimed in claim 19, wherein the first capacitor group or the second capacitor group comprises T composed capacitors, N is an integer greater than 1, and T is a positive integer greater than or equal to 1 and is smaller than or equal to N-1, wherein:
   in a first mode, the first value V1 is input to an composed capacitor Ei of the first capacitor group or the second capacitor group of itself, and the second value V0 is input to other composed capacitors; and
   in a second mode, the second value V0 is input to the $i^{th}$ composed capacitor Ei of the first capacitor group or the second capacitor group of itself, the first value V1 is input to at least one of the composed capacitors of the first capacitor group or the second capacitor group of counterpart, and the first value V1 is input to at least one of the composed capacitors of the first capacitor group or the second capacitor group of itself other than the $i^{th}$ composed capacitor, an output of the digital-to-analog converter in the first mode approaches to an output of the digital-to-analog converter in the second mode, and the weighting code $K_i$ of the $i^{th}$ composed capacitor of the first capacitor group or the second capacitor group of itself relative to the first capacitor group or the second capacitor group of counterpart is obtained according to the input value of each of the composed capacitors of the first capacitor group or the second capacitor group of counterpart and the input value of the composed capacitors of the first capacitor group or the second capacitor group of itself other than the $i^{th}$ composed capacitor, wherein i is a positive integer greater than or equal to 1 and is smaller than or equal to T.

21. The analog-to-digital converter as claimed in claim 17, wherein the first capacitor group or the second capacitor group comprises T composed capacitors, N is an integer greater than 1, T is a positive integer greater than or equal to 1 and is smaller than or equal to N-1, wherein:
the calibration logic circuit calculates the group weighting value of an $(i+1)^{th}$ composed capacitor of the first capacitor group or the second capacitor group of itself according to the weighting code $K_{i+1}$ of the $(i+1)^{th}$ composed capacitor of the first capacitor group or the second capacitor group of itself and the group weighting values of the first, the second, . . . , and the $i^{th}$ composed capacitors of the first capacitor group or the second capacitor group of itself, wherein i is a positive integer greater than or equal to 1 and is smaller than or equal to T.

22. The analog-to-digital converter as claimed in claim 17, wherein the first capacitor group comprises U composed capacitors, and the second capacitor group comprises V composed capacitors, N is an integer greater than 1, U is a positive integer greater than or equal to 1 and is smaller than or equal to N-1, V is equal to N-U, wherein:
the calibration logic circuit calculates the equivalent weighting value of an $(i+1)^{th}$ composed capacitor of the second capacitor group according to the weighting code $K_{i+1}$ of the $(i+1)^{th}$ composed capacitor of the second capacitor group, the group weighting values of the first, the second, . . . , the $i^{th}$ composed capacitors of the second capacitor group and the group weighting values of the first, the second, . . . , the $U^{th}$ composed capacitors of the first capacitor group, or calculates the equivalent weighting value of a $(j+1)^{th}$ composed capacitor of the first capacitor group according to the weighting code $K_{j+1}$ of the $(j+1)^{th}$ composed capacitor of the first capacitor group, the group weighting values of the first, the second, . . . , the $j^{th}$ composed capacitors of the first capacitor group and the group weighting values of the first, the second, . . . , the $V^{th}$ composed capacitors of the second capacitor group, wherein i is a positive integer greater than or equal to 1 and is smaller than or equal to V, and j is a positive integer greater than or equal to 1 and is smaller than or equal to U.

* * * * *